US012327731B2

(12) United States Patent
Son et al.

(10) Patent No.: US 12,327,731 B2
(45) Date of Patent: Jun. 10, 2025

(54) ETCHING GAS MIXTURE AND METHOD OF MANUFACTURING INTEGRATED CIRCUIT DEVICE USING THE SAME

(71) Applicant: SAMSUNG ELECTRONICS CO., LTD., Suwon-si (KR)

(72) Inventors: Changgil Son, Suwon-si (KR); Nathan Stafford, Bear, DE (US); Jinhwan Lee, Suwon-si (KR); Hoyoung Jang, Suwon-si (KR)

(73) Assignees: SAMSUNG ELECTRONICS CO., LTD., Suwon-si (KR); L'Air Liquide Société Anonyme pour l'Etude et l'Exploitation des procédés Georges Claude, Paris (FR)

( * ) Notice: Subject to any disclaimer, the term of this patent is extended or adjusted under 35 U.S.C. 154(b) by 342 days.

(21) Appl. No.: 18/101,336

(22) Filed: Jan. 25, 2023

(65) Prior Publication Data
US 2023/0274943 A1 Aug. 31, 2023

Related U.S. Application Data

(60) Provisional application No. 63/314,011, filed on Feb. 25, 2022.

(30) Foreign Application Priority Data

Apr. 28, 2022 (KR) .................. 10-2022-0052877

(51) Int. Cl.
*H01L 21/311* (2006.01)
*H01L 21/02* (2006.01)
(Continued)

(52) U.S. Cl.
CPC .. *H01L 21/31116* (2013.01); *H01L 21/02164* (2013.01); *H01L 21/02167* (2013.01);
(Continued)

(58) Field of Classification Search
None
See application file for complete search history.

(56) References Cited

U.S. PATENT DOCUMENTS 8,207,066 B2 6/2012 Inoue et al.
9,691,630 B2 6/2017 Takahashi et al.
(Continued)

FOREIGN PATENT DOCUMENTS

JP 2006310696 A 11/2006

*Primary Examiner* — Roberts P Culbert
(74) *Attorney, Agent, or Firm* — Sughrue Mion, PLLC

(57) ABSTRACT

An etching gas mixture includes a nitrogen-containing compound and an inert gas. To manufacture an integrated circuit (IC) device, a silicon-containing film on a substrate is etched by using plasma generated from the etching gas mixture, and thus a hole is formed in the silicon-containing film. The nitrogen-containing compound is selected from a compound represented by Formula 1 and a compound represented by Formula 2:

$(R^1)C\equiv N$ [Formula 1]

wherein in Formula 1, $R^1$ is a C2 to C3 linear or branched perfluoroalkyl group, $(R^2)(R^3)C=NH$ [Formula 2]

wherein in Formula 2, each of $R^2$ and $R^3$ is independently a C1 to C2 linear perfluoroalkyl group.

20 Claims, 25 Drawing Sheets

(51) Int. Cl.
*H01L 21/027* (2006.01)
*H01L 21/033* (2006.01)

(52) U.S. Cl.
CPC ...... *H01L 21/0217* (2013.01); *H01L 21/0271* (2013.01); *H01L 21/0332* (2013.01); *H01L 21/31144* (2013.01)

(56) References Cited

U.S. PATENT DOCUMENTS

| | | |
|---|---|---|
| 9,691,631 B2 | 6/2017 | Toda et al. |
| 10,163,653 B2 | 12/2018 | Kitagaito et al. |
| 10,566,211 B2 | 2/2020 | Chandrashekar et al. |
| 11,217,454 B2 | 1/2022 | Shinoda et al. |
| 2008/0000505 A1 | 1/2008 | McDermott et al. |
| 2008/0050926 A1* | 2/2008 | Nakagawa ........ H01L 21/31116 257/E21.252 |
| 2010/0219158 A1 | 9/2010 | Morikawa et al. |
| 2020/0227270 A1 | 7/2020 | Iwase et al. |
| 2022/0115240 A1* | 4/2022 | Oomori ................. C09K 13/02 |

\* cited by examiner

ETCHING GAS MIXTURE AND METHOD OF MANUFACTURING INTEGRATED CIRCUIT DEVICE USING THE SAME

CROSS-REFERENCE TO RELATED APPLICATIONS

This application is based on and claims priority to U.S. Provisional Application No. 63/314,011 and Korean Patent Application No. 10-2022-0052877, respectively filed on Feb. 25, 2022 and Apr. 28, 2022, the disclosures of which are incorporated herein in their entireties by reference.

BACKGROUND

The present disclosure relates to an etching gas mixture and a method of manufacturing an integrated circuit (IC) device using the same, and more particularly, to an etching gas mixture, which may be used to etch a silicon-containing film with plasma, and a method of manufacturing an IC device using the etching gas mixture.

Due to the development of the electronic technology, the downscaling of IC devices has rapidly progressed. Thus, structures of IC devices are becoming more complex, and aspect ratios of structures included in the IC devices have greatly increased. Accordingly, processes of forming three-dimensional (3D) structures having high aspect ratios have also become stricter. In particular, when a plasma etching process is performed to form vertical holes having a relatively high aspect ratio during a process of manufacturing an IC device with high integration, it is necessary to develop a technique of obtaining a desired vertical profile in a pattern obtained after the plasma etching process, and a technique capable of ensuring a desired etch rate.

SUMMARY

One or more embodiments provide an etching gas mixture, which may ensure a desired vertical profile and a desired etch rate, be easy to control a critical dimension (CD), and provide a high etch selectivity with respect to an etch mask, when a plasma etching process is performed to form a vertical hole having a relatively high aspect ratio.

One or more embodiments provide a method of manufacturing an integrated circuit (IC) device, by which when a plasma etching process is performed to form a vertical hole having a relatively high aspect ratio, a desired vertical profile and a desired etch rate may be ensured, it may be easy to control a CD, and a high etch selectivity with respect to an etch mask may be provided, and thus, the reliability and productivity of the IC device may be improved.

According to an aspect of an embodiment, there is provided an etching gas mixture including a nitrogen-containing compound and an inert gas. The nitrogen-containing compound is selected from a compound represented by Formula 1 and a compound represented by Formula 2:

$(R^1)C\equiv N$            [Formula 1]

wherein $R^1$ is a C2 to C3 linear or branched perfluoroalkyl group,

$(R^2)(R^3)C=NH$            [Formula 2]

wherein each of $R^2$ and $R^3$ is independently a C1 to C2 linear perfluoroalkyl group.

According to another aspect of an embodiment, there is provided an etching gas mixture including a nitrogen-containing compound, an inert gas, and at least one selected from a fluorine-containing gas, an oxygen-containing gas, and a C1 to C4 fluorinated hydrocarbon compound that does not include any nitrogen atoms. The nitrogen-containing compound is selected from a compound represented by Formula 1 and a compound represented by Formula 2. The fluorine-containing gas includes $NF_3$, $CF_4$, $F_2$, $SF_6$, or a combination thereof, the oxygen-containing gas includes $O_2$, $O_3$, $CO$, $CO_2$, $NO$, $N_2O$, $NO_2$, $CH_3OH$, $C_2H_5OH$, or a combination thereof, and the fluorinated hydrocarbon compound includes difluoromethane ($CH_2F_2$), fluoromethane ($CH_3F$), trifluoromethane ($CHF_3$), or a combination thereof.

According to another aspect of an embodiment, there is provided an etching gas mixture for selectively etching a silicon-containing film by using an etching mask pattern including a carbon-containing film. The etching gas mixture includes a nitrogen-containing compound and an inert gas. The nitrogen-containing compound is selected from a compound represented by Formula 1 and a compound represented by Formula 2.

According to another aspect of an embodiment, there is provided a method of manufacturing an IC device. The method includes forming a hole in a silicon-containing film on a substrate by etching the silicon-containing film by using plasma generated from an etching gas mixture. The etching gas mixture includes a nitrogen-containing compound and an inert gas, and the nitrogen-containing compound is selected from a compound represented by Formula 1 and a compound represented by Formula 2.

According to another aspect of an embodiment, there is provided a method of manufacturing an IC device. The method includes forming, on a substrate, an etching target structure including a silicon-containing film, forming a mask pattern having an opening on the etching target structure, and forming a hole in the etching target structure by anisotropically etching the etching target structure through the opening by using the mask pattern as an etch mask and using plasma generated from an etching gas mixture. The hole extends in a vertical direction from the opening of the mask pattern toward the substrate. The etching gas mixture includes a nitrogen-containing compound, an inert gas, and at least one selected from a fluorine-containing gas, an oxygen-containing gas, and a C1 to C4 fluorinated hydrocarbon compound that does not include any nitrogen atoms. The nitrogen-containing compound is selected from a compound represented by Formula 1 and a compound represented by Formula 2. The fluorine-containing gas includes $NF_3$, $CF_4$, $F_2$, $SF_6$, or a combination thereof. The oxygen-containing gas includes $O_2$, $O_3$, $CO$, $CO_2$, $NO$, $N_2O$, $NO_2$, $CH_3OH$, $C_2H_5OH$, or a combination thereof. The fluorinated hydrocarbon compound includes difluoromethane ($CH_2F_2$), fluoromethane ($CH_3F$), trifluoromethane ($CHF_3$), or a combination thereof.

According to another aspect of an embodiment, there is provided a method of manufacturing an IC device. The method includes forming an etching target structure on a substrate. The etching target structure includes a first silicon-containing film, which does not include any nitrogen atoms, and a second silicon-containing film including nitrogen atoms. A mask pattern having an opening is formed on the etching target structure. The etching target structure is anisotropically etched by using the mask pattern as an etch mask, and thus, a hole is formed in the etching target structure. The hole passes through the first silicon-containing film and the second silicon-containing film in a vertical direction. The formation of the hole includes anisotropically etching the first silicon-containing film through the opening by using first plasma generated from a first etching gas mixture and anisotropically etching the second silicon-containing film through the opening by using second plasma generated from a second etching gas mixture. The first etching gas mixture includes a first nitrogen-containing compound and a first inert gas. The second etching gas mixture includes a second nitrogen-containing compound, a second inert gas, and a C1 to C4 fluorinated hydrocarbon compound that does not include any nitrogen atoms. Each of the first nitrogen-containing compound and the second nitrogen-containing compound is selected from a compound represented by Formula 1 and a compound represented by Formula 2.

BRIEF DESCRIPTION OF THE DRAWINGS

Embodiments of the present disclosure will be more clearly understood from the following detailed description taken in conjunction with the accompanying drawings in which:

FIGS. 4A, 4B, 5A, 5B, 6A, 6B, 7A, and 7B are cross-sectional views illustrating a process sequence of a method of manufacturing an IC device, according to embodiments, wherein FIGS. 4A, 5A, 6A, and 7A are cross-sectional views according to a process sequence in a memory cell region of the IC device, and FIGS. 4B, 5B, 6B, and 7B are cross-sectional views according to a process sequence in a connection region of the IC device;

DETAILED DESCRIPTION OF THE EMBODIMENTS

Figure 1:
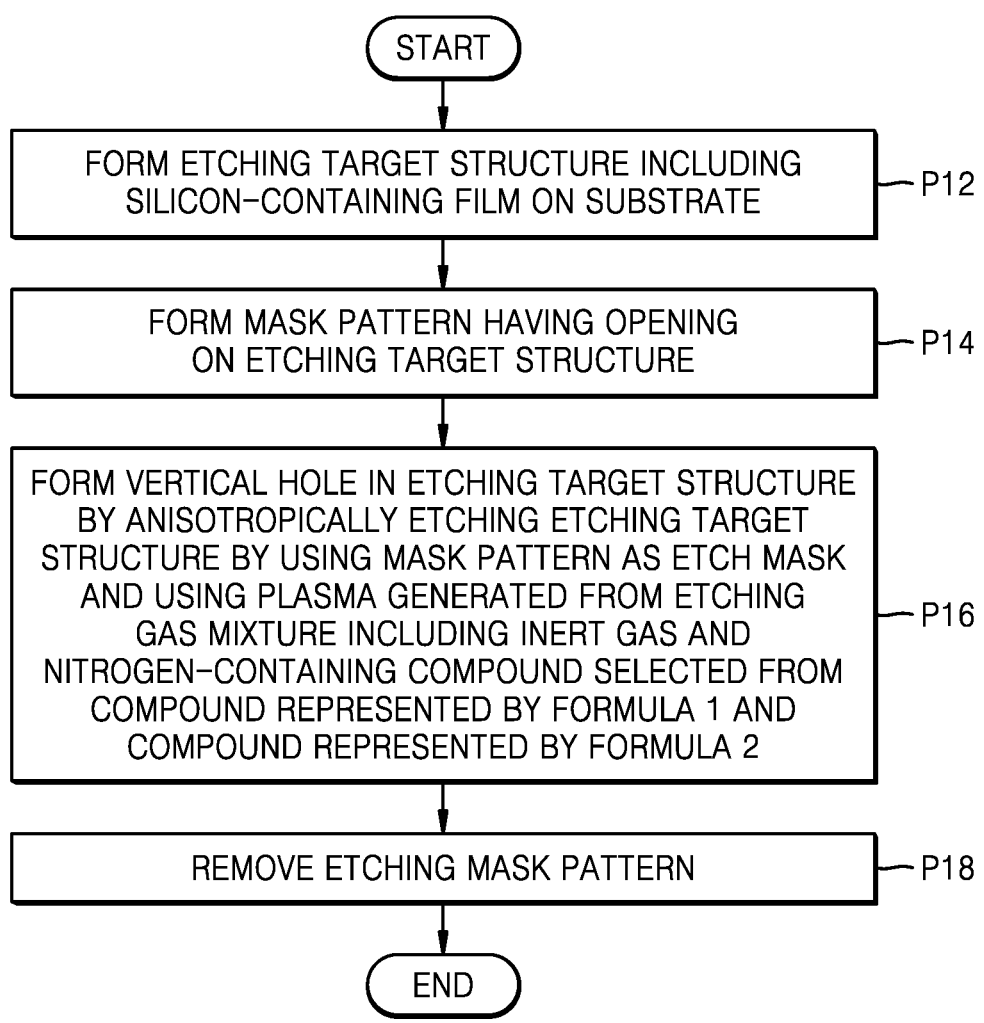
FIG. 1 is a flowchart of a method of manufacturing an integrated circuit (IC) device, according to embodiments.

Hereinafter, embodiments will be described in detail with reference to the accompanying drawings. The same reference numerals are used to denote the same elements in the drawings, and repeated descriptions thereof will be omitted.

The etching gas mixture according to an embodiment may include a nitrogen-containing compound and an inert gas. The nitrogen-containing compound may be selected from a compound represented by Formula 1 and a compound represented by Formula 2:

(R$^1$)C≡N    [Formula 1]

wherein R$^1$ is a C2 to C3 linear or branched perfluoroalkyl group, (R$^2$)(R$^3$)C=NH    [Formula 2]

wherein each of R$^2$ and R$^3$ is independently a C1 to C2 linear perfluoroalkyl group.

In the etching gas mixture according to embodiments, the nitrogen-containing compound may consist essentially of the compound represented by Formula 1. In this case, the nitrogen-containing compound may not include any hydrogen atoms. In embodiments, the nitrogen-containing compound may consist essentially of the compound represented by Formula 1. In Formula 1, R$^1$ may be a C2 to C3 linear perfluoroalkyl group. For example, the nitrogen-containing compound may consist essentially of the compound represented by Formula 1. In Formula 1, R$^1$ may be a pentafluoroethyl group, a heptafluoropropyl group, or a heptafluoroisopropyl group.

In the etching gas mixture according to other embodiments, the nitrogen-containing compound may consist essentially of the compound represented by Formula 2. In this case, the nitrogen-containing compound may include a compound including one hydrogen atom. In embodiments, R$^2$ and R$^3$ may have the same structure as each other.

In embodiments, the nitrogen-containing compound may include at least one selected from Chemical Formulas 1 to 4:

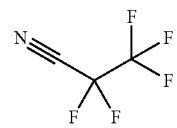

[Chemical Formula 1]

(Pentafluoropropionitrile, CAS No. 422-04-8)

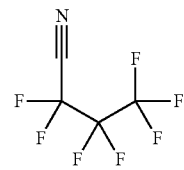

[Chemical Formula 2]

(Heptafluorobutyronitrile, CAS No. 375-00-8)

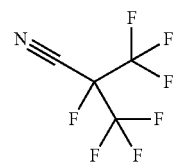

[Chemical Formula 3]

(Heptafluoroisobutyronitrile, CAS No. 42532-60-5)

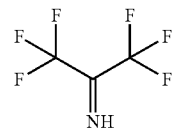

[Chemical Formula 4]

(Hexafluoroacetone imine, CAC No. 1645-75-6)

In the etching gas mixture according to embodiments, the inert gas may include argon (Ar), helium (He), neon (Ne), nitrogen (N$_2$), krypton (Kr), xenon (Xe), or a mixture thereof.

In the etching gas mixture according to embodiments, each of the nitrogen-containing compound and the inert gas may be supplied onto a film to be etched at a flow rate of about 5 sccm to about 200 sccm in a plasma atmosphere. In the etching gas mixture according to embodiments, each of the nitrogen-containing compound and the inert gas may be included in an amount of about 10% by volume to about 90% by volume, based on a total volume of the etching gas mixture, without being limited thereto.

The etching gas mixture according to embodiments may be an etching gas mixture for selectively etching a silicon-containing film by using an etching mask pattern including a carbon-containing film. The silicon-containing film may include a silicon oxide (SiO) film, a silicon nitride (SiN) film, a silicon oxynitride (SiON) film, a silicon carbonitride (SiCN) film, a silicon oxycarbonitride (SiOCN) film, a silicon carbide (SiC) film, a silicon oxycarbide (SiOC) film, a silicon boron nitride (SiBN) film, an amorphous hydrogenated silicon nitride (a-SiN:H) film, or a combination thereof. As used herein, each of the terms "SiO," "SiN," "SiON," "SiCN," "SiOCN," "SiC," "SiOC," and "SiBN" refers to a material including elements included therein, without referring to a chemical formula representing a stoichiometric relationship. In an example, the SiO film may be a $SiO_2$ film. In an example, the SiN film may be a $Si_3N_4$ film. The carbon-containing film may include an amorphous carbon layer (ACL), a spin-on-hardmask (SOH), a photoresist, or a combination thereof.

The etching gas mixture according to embodiments may be advantageously applied to an etching process for forming various vertical holes having a relatively high aspect ratio. For example, the etching gas mixture according to embodiments may be advantageously applied to a process of forming a channel hole to manufacture vertical NAND (VNAND) flash memory (or vertical channel NAND flash memory), a process of forming a lower electrode hole to manufacture a capacitor of dynamic random access memory (DRAM), or a process of forming a vertical hole for forming a wiring layer required to configure DRAM, magnetic RAM (MRAM), static RAM (SRAM), phase-change RAM (PRAM), resistive RAM (RRAM), ferroelectric RAM (FRAM), VNAND flash memory, or a logic device including various logic cells.

Because the etching gas mixture according to embodiments includes the nitrogen-containing compound selected from the compound represented by Formula 1 and the compound represented by Formula 2, which are described above, when a vertical hole having a relatively high aspect ratio is formed by etching a silicon-containing film by using plasma generated from the etching gas mixture according to embodiments, stable plasma may be supplied due to excellent dissociation effects of the nitrogen-containing compound in the plasma atmosphere. Accordingly, an etch selectivity of the silicon-containing film with respect to an etch mask may be increased, and the occurrence of a bowing phenomenon in the vertical hole may be inhibited. In addition, nitrogen atoms included in the nitrogen-containing compound may combine with fluorine atoms included in an etching byproduct to generate volatile substances. Thus, the volatile substances may serve as a scavenger for the fluorine atoms included in the etching byproduct. Accordingly, the generated amount of polymer byproducts including carbon atoms and fluorine atoms may be remarkably reduced, and thus, a profile of the vertical hole may be improved. Furthermore, the nitrogen-containing compound may include an etch selectivity of the silicon-containing film with respect to an etch mask. Therefore, the etching gas mixture according to embodiments may achieve a high etch selectivity and be excellent in critical dimension (CD) control, compared to an etching gas mixture including a compound that does not include any nitrogen atoms, for example, a CHF-based compound including only carbon atoms, hydrogen atoms, and fluorine atoms.

In the etching gas mixture according to embodiments, the inert gas may control a concentration of the nitrogen-containing compound within a desired range in the etching gas mixture.

The etching gas mixture according to embodiments may further include at least one CD-adjusting gas selected from a fluorine-containing gas and an oxygen-containing gas. The fluorine-containing gas may include $NF_3$, $CF_4$, $F_2$, $SF_6$, or a combination thereof. The oxygen-containing gas may include $O_2$, $O_3$, $CO$, $CO_2$, $NO$, $N_2O$, $NO_2$, $CH_3OH$, $C_2H_5OH$, or a combination thereof.

When a vertical hole having a relatively high aspect ratio is formed by etching the silicon-containing film by using plasma generated from the etching gas mixture according to embodiments, the CD-adjusting gas may increase the CD of the vertical hole. In the etching gas mixture according to embodiments, as the content of the CD-adjusting gas increases, the CD of the vertical hole may increase.

In the etching gas mixture according to embodiments, when the oxygen-containing gas is used as the CD-adjusting gas, the etching gas mixture may include a nitrogen-containing compound, which is selected from the compound represented by Formula 1 and the compound represented by Formula 2, which are described above. In this case, the content of the oxygen-containing gas may be minimized compared to a case of using an etching gas mixture including a CHF-based compound instead of the nitrogen-containing compound. In addition, in the etching gas mixture according to embodiments, when the oxygen-containing gas is used as the CD-adjusting gas, even when an etching byproduct containing oxygen atoms occurs, the nitrogen atoms included in the nitrogen-containing compound may combine with the oxygen atoms included in the etching byproduct to generate volatile substances. Accordingly, the volatile substances may serve as a scavenger for the oxygen atoms included in the etching byproduct. Accordingly, the profile of the vertical hole may be improved, and an etch selectivity with respect to an etch mask may be increased.

When the CD-adjusting gas is included in the etching gas mixture according to embodiments, the CD-adjusting gas may be supplied onto a film to be etched, at a flow rate of about 2 sccm to about 20 sccm. In the etching gas mixture according to embodiments, the CD-adjusting gas may be included in an amount of about 1% by volume to about 20% by volume, based on a total volume of the etching gas mixture, without being limited thereto.

The etching gas mixture according to embodiments may further include a C1 to C4 fluorinated hydrocarbon compound that does not include any nitrogen atoms.

In embodiments, when a vertical hole having a relatively high aspect ratio is formed by etching the silicon-containing film by using plasma generated from the etching gas mixture according to embodiments, the C1 to C4 fluorinated hydrocarbon compound that does not include any nitrogen atoms may reduce the CD of the vertical hole. In the etching gas mixture according to embodiments, as the content of the C1 to C4 fluorinated hydrocarbon compound that does not include any nitrogen atoms increases, the CD of the vertical hole may be reduced.

In the process of forming a vertical hole having a relatively high aspect ratio by etching the silicon-containing film by using plasma generated from the etching gas mixture according to other embodiments, when a silicon-containing film (e.g., a silicon nitride film) including nitrogen atoms is etched, the C1 to C4 fluorinated hydrocarbon compound that does not include any nitrogen atoms may increase an etch selectivity of the silicon-containing film with respect to an etch mask.

In the etching gas mixture according to embodiments, the C1 to C4 fluorinated hydrocarbon compound that does not include any nitrogen atoms may include difluoromethane ($CH_2F_2$), fluoromethane ($CH_3F$), trifluoromethane ($CHF_3$), 1,1,1,2,3,3-hexafluoropropane ($C_3H_2F_6$), 1,1,1,3,3-pentafluoropropane ($C_3H_3F_5$), 1,1,2,2,3-pentafluoropropane ($C_3H_3F_5$), octafluorocyclobutane ($C_4F_8$), hexafluoro-1,3-butadiene ($C_4F_6$), $C_4H_2F_6$, 1,1,2,2,3-pentafluorocyclobutane ($C_4H_3F_5$), 1,1,2,2-tetrafluorocyclobutane ($C_4H_4F_4$), or a combination thereof. Here, $C_4H_2F_6$ may be trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), or cis-1,1,2,2,3,4-hexafluorocyclobutane (cis-$C_4H_2F_6$). For example, the C1 to C4 fluorinated hydrocarbon compound that does not include any nitrogen atoms may be selected from $CH_2F_2$, $CH_3F$, and $CHF_3$.

When the etching gas mixture according to embodiments includes a C1 to C4 fluorinated hydrocarbon compound that does not include any nitrogen atoms, the fluorinated hydrocarbon compound may be supplied onto a film to be etched at a flow rate of about 2 sccm to about 20 sccm. In the etching gas mixture according to embodiments, the fluorinated hydrocarbon compound may be included in an amount of about 1% by volume to about 20% by volume, based on a total volume of the etching gas mixture, without being limited thereto.

Next, the effects of etching gas mixtures according to embodiments will be described with reference to Evaluation examples together with Comparative example.

Evaluation Example (Evaluation of Polishing Rate)

As etching gas mixtures according to embodiments, etching gas mixtures were obtained by mixing each of a nitrogen-containing compound represented by Chemical Formula 1, a nitrogen-containing compound represented by Chemical Formula 2, a nitrogen-containing compound represented by Chemical Formula 3, and a nitrogen-containing compound represented by Chemical Formula 4 with an inert gas including argon (Ar). A silicon oxide ($SiO_2$) film was etched by using plasma generated from each of the obtained etching gas mixtures, and thus, a vertical hole was formed in the silicon oxide film. In this case, an etching mask pattern including an ACL was used as an etching mask pattern.

As a Comparative example, a silicon oxide film was etched under the same conditions except that $C_4F_8$ was used instead of the nitrogen-containing compound. Thus, a vertical hole was formed in the silicon oxide film.

When each of the etching gas mixtures including the nitrogen-containing compounds represented by Chemical Formulas 1 to 4 and the etching gas mixture according to the Comparative example was used, an etch rate of the silicon oxide film and an etch selectivity of the silicon oxide film with respect to the etching mask pattern was measured, and the results were shown in Table 1.

TABLE 1

| | Etch gas | etch rate (Å/min) | etch selectivity |
|---|---|---|---|
| Example 1 | Chemical Formula 1 | 3920 | 2.4 |
| Example 2 | Chemical Formula 2 | 4820 | 3.7 |
| Example 3 | Chemical Formula 3 | 4200 | 2.2 |
| Example 4 | Chemical Formula 4 | 3760 | 5.5 |
| Comparative example | $C_4F_8$ | 4900 | 2.1 |

From the results of Table 1, it can be seen that an etch selectivity of each of Examples 1 to 4 is superior to an etch selectivity of the Comparative example. In particular, it can be seen that an etch rate of Example 2 is substantially similar to an etch rate of the Comparative example, and the etch selectivity of Example 2 is much higher than the etch selectivity of the Comparative example.

As described above, when a silicon-containing film is etched in a plasma atmosphere to form a vertical hole having a relatively high aspect ratio, an etching gas mixture according to embodiments may be advantageously used to obtain a desired etch rate while ensuring a desired vertical profile in the vertical hole, the CD of the vertical hole may be easy to control, and a high etch selectivity with respect to an etch mask containing carbon atoms may be provided.

A method of manufacturing an IC device, according to embodiments, will now be described in detail.

Figure 2A:
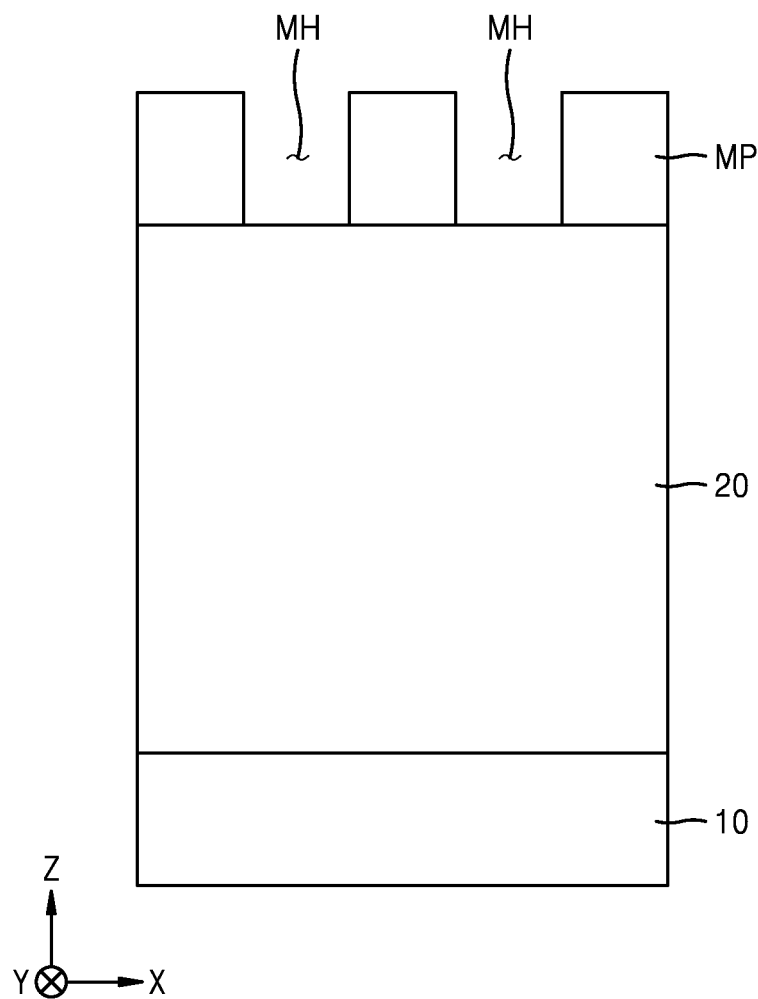
FIGS. 2A to 2C are cross-sectional views illustrating a process sequence of a method of manufacturing an IC device, according to embodiments.
Figure 2B:
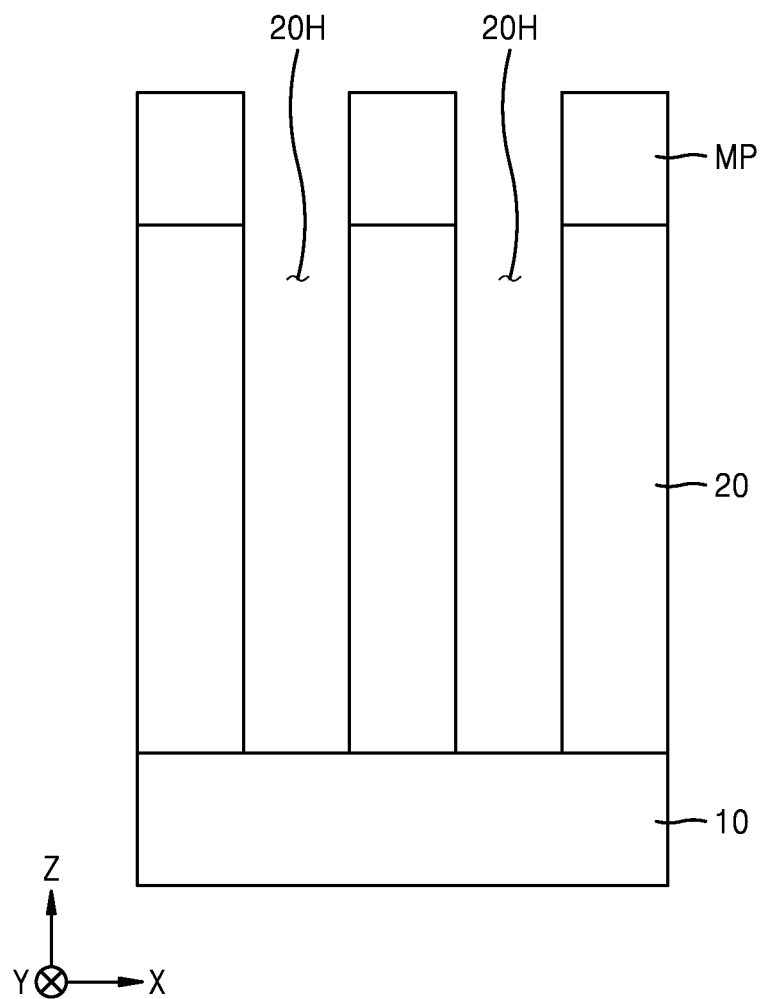
Figure 2C:
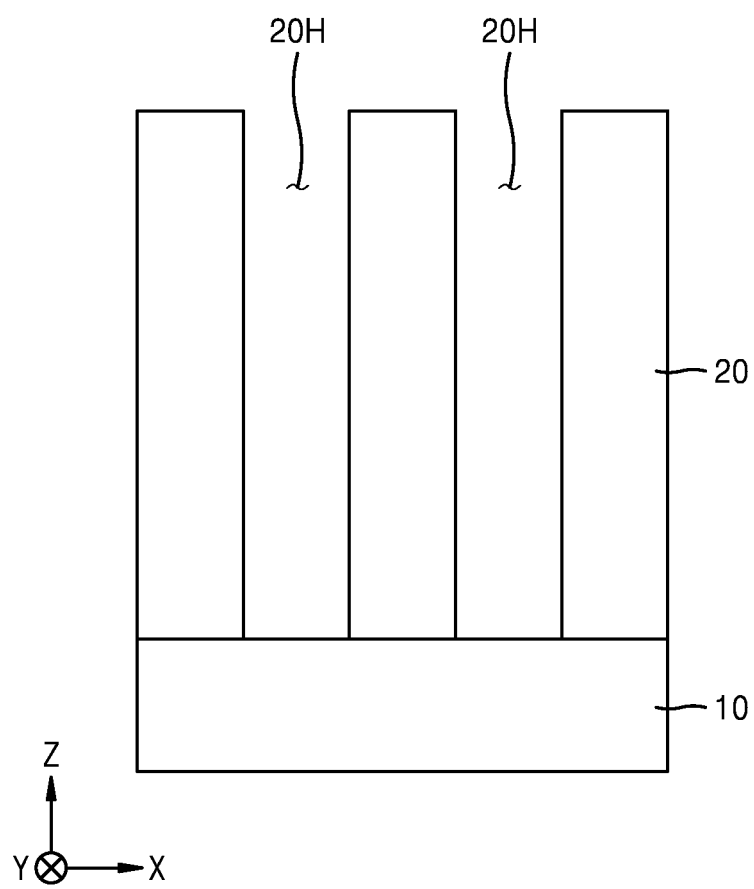

FIG. 1 is a flowchart of a method of manufacturing an integrated circuit (IC) device according to embodiments. FIGS. 2A to 2C are cross-sectional views illustrating a process sequence of a method of manufacturing an IC device, according to embodiments.

Referring to FIGS. 1 and 2A, in process P12, an etching target structure 20 including a silicon-containing film may be formed on a substrate 10. In process P14, a mask pattern MP having a plurality of openings MH may be formed on the etching target structure 20.

As used herein, the term "substrate" may refer to a substrate itself, or a stack structure including a substrate and a certain layer, film, or the like on a surface of the substrate. In addition, the term "surface of a substrate" may refer to an exposed surface of a substrate itself, or an outer surface of a certain layer, film, or the like on the substrate. The substrate 10 may include a semiconductor substrate. In embodiments, the substrate 10 may include a semiconductor, such as silicon (Si) or germanium (Ge). In other embodiments, the substrate 10 may include a compound semiconductor, such as silicon germanium (SiGe), silicon carbide (SiC), gallium arsenide (GaAs), indium arsenide (InAs), or indium phosphide (InP). In still other embodiments, the substrate 10 may have a silicon-on-insulator (SOI) structure. The substrate 10 may include a conductive region, for example, a doped well or a doped structure. In other embodiments, the substrate 10 may include a transparent substrate.

The etching target structure 20 may include an insulating structure including at least one insulating film. In embodiments, the at least one insulating film may include a silicon oxide (SiO) film, a silicon nitride (SiN) film, a silicon oxynitride (SiON) film, a silicon carbonitride (SiCN) film, a silicon oxycarbonitride (SiOCN) film, a silicon carbide (SiC) film, a silicon oxycarbide (SiOC) film, a silicon boron nitride (SiBN) film, an amorphous hydrogenated silicon nitride (a-SiN:H) film, or a combination thereof. For example, the etching target structure 20 may include tetraethylorthosilicate (TEOS), plasma-enhanced tetraethylorthosilicate (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), or a combination thereof.

In other embodiments, the etching target structure 20 may include a semiconductor film. For example, the etching target structure 20 may include crystalline silicon, amorphous silicon, doped silicon, SiGe, SiC, or a combination thereof, without being limited thereto. In still other embodiments, the etching target structure 20 may include at least one conductive film. For example, the etching target structure 20 may include a doped polysilicon film.

In embodiments, the mask pattern MP may include a carbon-containing film. For example, the mask pattern MP may include an ACL, an SOH, a photoresist, or a combination thereof, without being limited thereto.

Referring to FIGS. 1 and 2B, in process P16, portions of the etching target structure 20 may be etched through the openings (refer to MH in FIG. 2A) in the resultant structure of FIG. 2A, and thus, a plurality of vertical holes 20H may be formed in the etching target structure 20. The plurality of vertical holes 20H may extend in a vertical direction toward the substrate 10 from the plurality of openings MH formed in the mask pattern MP.

In the etching process for forming the plurality of vertical holes 20H in the etching target structure 20 according to process P16 of FIG. 1, the etching target structure 20 may be anisotropically etched through the plurality of openings MH formed in the mask pattern MP by using the mask pattern MP as an etch mask and by using plasma generated from an etching gas mixture according to embodiments. To this end, the resultant structure of FIG. 2A may be loaded into a reaction chamber of a plasma etching apparatus.

In embodiments, the plasma etching apparatus may include reactive ion etching (RIE) equipment, magnetically enhanced RIE (MERIE) equipment, inductively coupled plasma (ICP) equipment, capacitively coupled plasma (CCP) equipment, hollow-anode-type plasma equipment, helical resonator plasma equipment, or electron cyclotron resonance (ECR) plasma equipment.

The reaction chamber of the plasma etching apparatus may include a first electrode and a second electrode, which may face each other in the vertical direction and each apply radio frequency (RF) power. The reaction chamber may provide a reaction space in which a plasma etching process is performed between the first electrode and the second electrode. The substrate 10 may be placed in the reaction space on the first electrode such that a main surface of the substrate 10 faces the second electrode. An etching process for forming the plurality of vertical holes 20H may be performed on the etching target structure 20 in a state in which the substrate 10 is placed on the first electrode. In embodiments, the plurality of vertical holes 20H may be formed to pass through the etching target structure 20 in a vertical direction (Z direction).

To form the plurality of vertical holes 20H in the etching target structure 20 according to process P16 of FIG. 1, an etching gas mixture may be supplied into the reaction chamber in a plasma atmosphere. Details of the etching gas mixture may be the same as those of the above-described etching gas mixture according to embodiments.

In embodiments, when the etching target structure 20 includes a silicon-containing film that does not include any nitrogen atoms, an etching gas mixture supplied into the reaction chamber to form the plurality of vertical holes 20H in the etching target structure 20 may include a nitrogen-containing compound and an inert gas, and the nitrogen-containing compound may be selected from the compound represented by Formula 1 and the compound represented by Formula 2, which are described above. When necessary, the etching gas mixture may further include at least one CD-adjusting gas selected from a fluorine-containing gas and an oxygen-containing gas. Details of the nitrogen-containing compound, the inert gas, the fluorine-containing gas, and the oxygen-containing gas may be the same as those in the above-described etching gas mixture according to embodiments. In embodiments, the fluorine-containing gas may include $NF_3$, $CF_4$, $F_2$, $SF_6$, or a combination thereof, and the oxygen-containing gas may include $O_2$, $O_3$, $CO$, $CO_2$, $NO$, $N_2O$, $NO_2$, $CH_3OH$, $C_2H_5OH$, or a combination thereof, without being limited thereto.

In other embodiments, when the etching target structure 20 includes a silicon-containing film including nitrogen atoms, an etching gas mixture supplied into the reaction chamber to form the plurality of vertical holes 20H in the etching target structure 20 may include a nitrogen-containing compound, an inert gas, and a C1 to C4 fluorinated hydrocarbon compound that does not include any nitrogen atoms. The nitrogen-containing compound may be selected from the compound represented by Formula 1 and the compound represented by Formula 2, which are described above. When necessary, the etching gas mixture may further include at least one CD-adjusting gas selected from a fluorine-containing gas and an oxygen-containing gas. Details of the nitrogen-containing compound, the inert gas, the fluorinated hydrocarbon compound, the fluorine-containing gas, and the oxygen-containing gas may be the same as those in the above-described etching gas mixture according to embodiments. In embodiments, the fluorinated hydrocarbon compound may include difluoromethane ($CH_2F_2$), fluoromethane ($CH_3F$), trifluoromethane ($CHF_3$), or a combination thereof, without being limited thereto.

FIGS. 3A to 3D each show pulse diagrams of components included in an etching gas mixture supplied into the reaction chamber in a plasma atmosphere to form the plurality of vertical holes 20H in the etching target structure 20 according to process P16 of FIG. 1.

In FIGS. 3A to 3D, A denotes a compound selected from the compound represented by Formula 1 and the compound represented by Formula 2, which are described above, B denotes an inert gas, C denotes a CD-adjusting gas selected from a fluorine-containing gas and an oxygen-containing gas, and D denotes a C1 to C4 fluorinated hydrocarbon compound that does not include any nitrogen atoms.

Figure 3A:
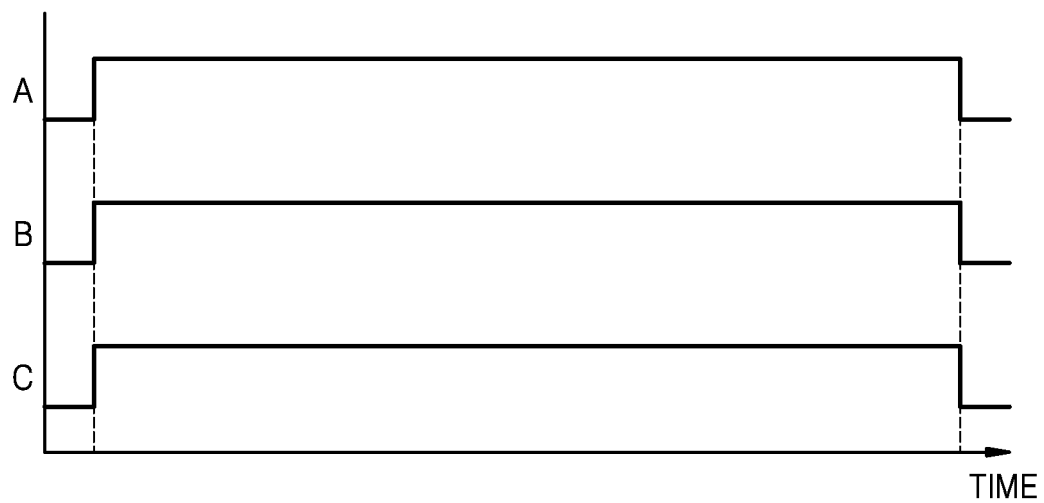
FIGS. 3A to 3D each show a pulse diagram of components included in an etching gas mixture supplied into a reaction chamber in a plasma atmosphere during the formation of a vertical hole in an etching target structure by using a method of manufacturing an IC device, according to embodiments.

In embodiments, to form the plurality of vertical holes 20H in the etching target structure 20 as shown in FIG. 2B according to process P16 of FIG. 1, as shown in FIG. 3A, a nitrogen-containing compound A, an inert gas B, and a CD-adjusting gas C may be continuously supplied onto a substrate 10 in a plasma atmosphere.

Figure 3B:
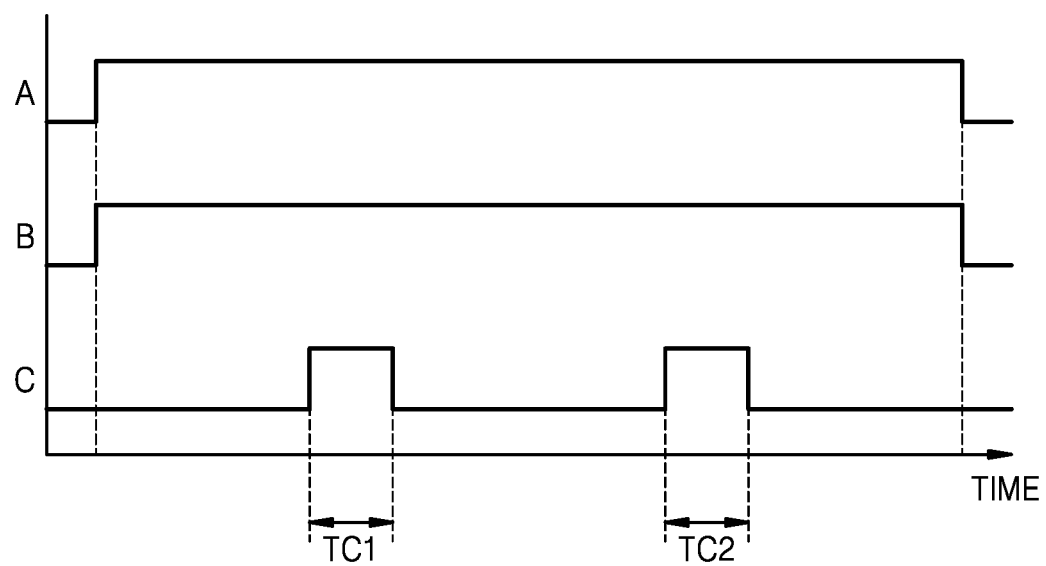

In other embodiments, to form the plurality of vertical holes 20H in the etching target structure 20 as shown in FIG. 2B according to process P16 of FIG. 1, as shown in FIG. 3B, the nitrogen-containing compound A and the inert gas B may be continuously supplied onto the substrate 10 in a plasma atmosphere, and the CD-adjusting gas C may be intermittently supplied onto the substrate 10 only during some time periods (e.g., TC1 and TC2). The time periods (e.g., TC1 and TC2) may be selected from among time periods, which require increasing the CD of the vertical holes 20H, of an etching process for forming the plurality of vertical holes 20H desired to be formed.

Figure 3C:
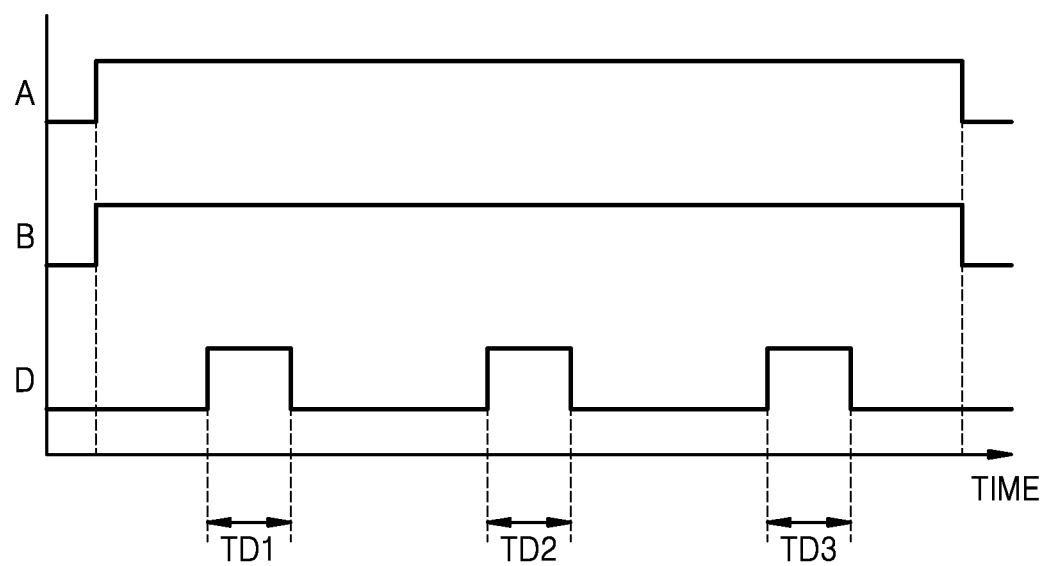

In still other embodiments, to form the plurality of vertical holes 20H in the etching target structure 20 as shown in FIG. 2B according to process P16 of FIG. 1, as shown in FIG. 3C, the nitrogen-containing compound A and the inert gas B may be continuously supplied onto the substrate 10 in a plasma atmosphere, and the fluorinated hydrocarbon compound D may be intermittently supplied onto the substrate 10 only during some time periods (e.g., TD1, TD2, and TD3). The time periods (e.g., TD1, TD2, and TD3) may be selected from among time periods, which require etching a silicon-containing film (e.g., a SiN film, a SiCN film, or a SiBN film) including nitrogen atoms, which is partially inserted into the etching target structure 20, of an etching process for forming the plurality of vertical holes 20H desired to be formed.

Figure 3D:
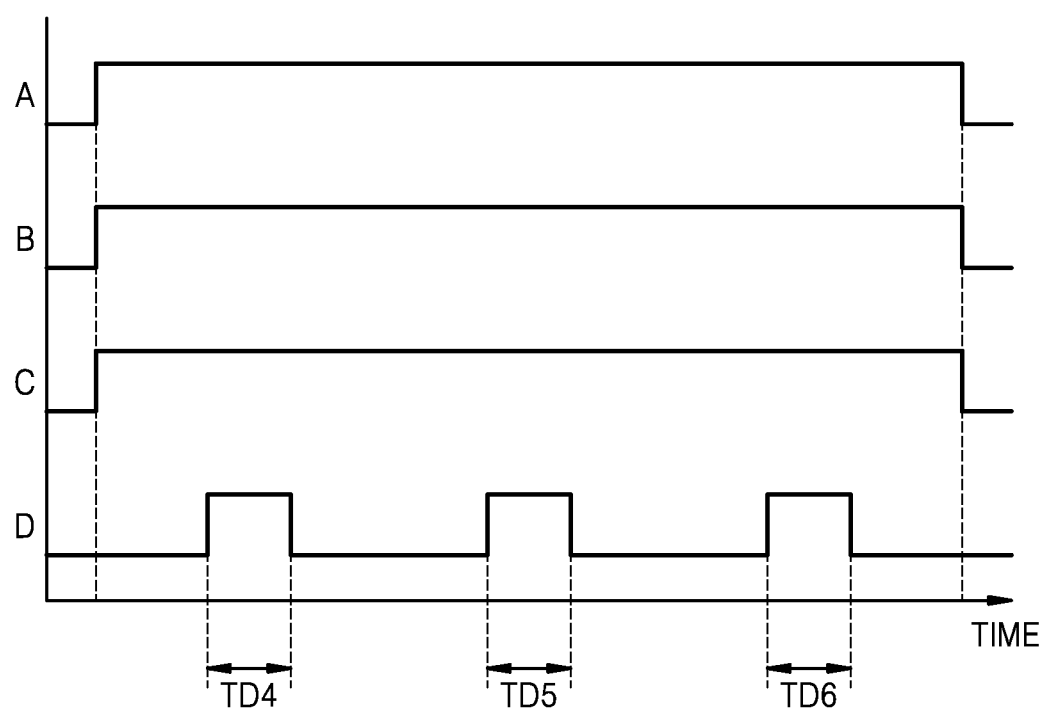

In still other embodiments, to form the plurality of vertical holes 20H in the etching target structure 20 as shown in FIG. 2B according to process P16 of FIG. 1, as shown in FIG. 3D, the nitrogen-containing compound A, the inert gas B, and the CD-adjusting gas C may be continuously supplied onto the substrate 10 in a plasma atmosphere, and the fluorinated hydrocarbon compound D may be intermittently supplied onto the substrate 10 only during some time periods (e.g., TD4, TD5, and TD6). The time periods (e.g., TD4, TD5, and TD6) may be selected from among time periods, which require etching a silicon-containing film (e.g., a SiN film, a SiCN film, or a SiBN film) including nitrogen atoms, which is partially inserted into the etching target structure 20, of an etching process for forming the plurality of vertical holes 20H desired to be formed.

Referring back to FIG. 2B, the plasma etching process for forming the plurality of vertical holes 20H in the etching target structure 20 may be performed at a process temperature of room temperature (e.g., a temperature of about 20° C. to about 28° C.) to about 500° C. under a process pressure of about 1 mTorr to about 10 Torr, without being limited thereto.

During the plasma etching process for forming the plurality of vertical holes 20H as described with reference to FIG. 2B, the etching target structure 20 may be etched at a high etch selectivity with respect to the mask pattern MP, a desired etch rate may be obtained during the formation of the plurality of vertical holes 20H, and the CD of the plurality of vertical holes 20H may be easily controlled.

Referring to FIGS. 1 and 2C, in process P18, a cleaning process may be performed to remove the mask pattern MP remaining on the resultant structure of FIG. 2B and etching byproducts remaining inside and outside the plurality of vertical holes 20H. The cleaning process may be performed in a dry manner, a wet manner, or a combination thereof. In embodiments, the cleaning process may include an ashing process using $O_2$ plasma and a stripping process. The strip process may be performed using alcohol, acetone, or a mixture of nitric acid and sulfuric acid, without being limited thereto.

In embodiments, subsequent processing may be performed on the resultant structure of FIG. 2C, in which the plurality of vertical holes 20H are formed in the etching target structure 20, and thus, vertical plugs filling the plurality of vertical holes 20H may be formed. In embodiments, the vertical plug may constitute a channel structure, a dummy channel structure, a word line cut structure, a through electrode, and/or a memory cell contact, which constitute a memory cell array structure of a VNAND flash memory. In other embodiments, the vertical plug may be a lower electrode that constitutes a capacitor of DRAM.

FIGS. 4A to 7B are cross-sectional views illustrating a process sequence of a method of manufacturing an IC device (refer to 100 in FIGS. 7A and 7B) according to embodiments. Of FIGS. 4A to 7B, FIGS. 4A, 5A, 6A, and 7A are cross-sectional views according to a process sequence in a memory cell region MEC of the IC device 100, and FIGS. 4B, 5B, 6B, and 7B are cross-sectional views according to a process sequence in a connection region CON of the IC device 100. An example method of manufacturing the IC device 100 including a memory cell array structure of a VNAND flash memory will be described with reference to FIGS. 4A to 7B.

Figure 4A:
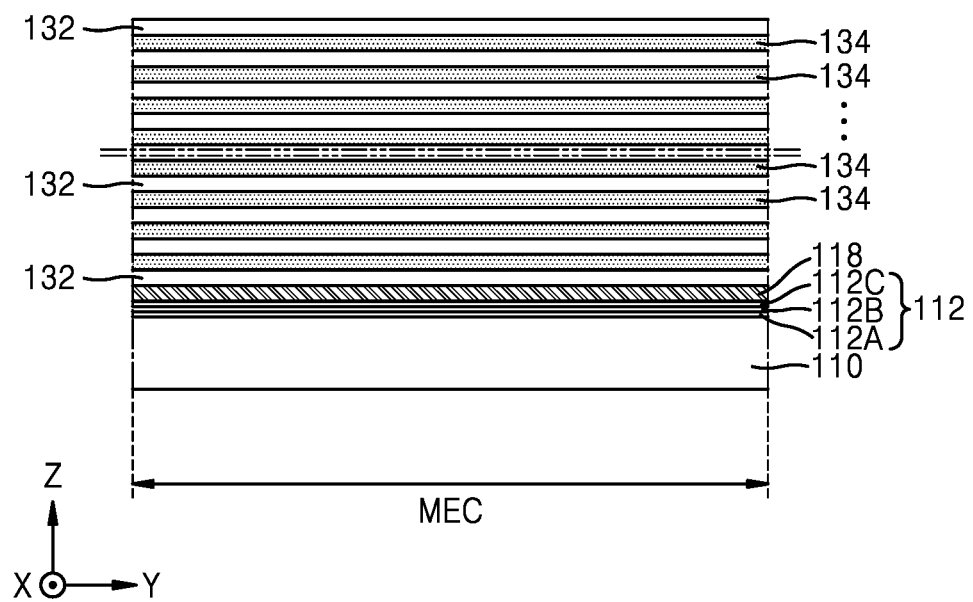
Figure 4B:
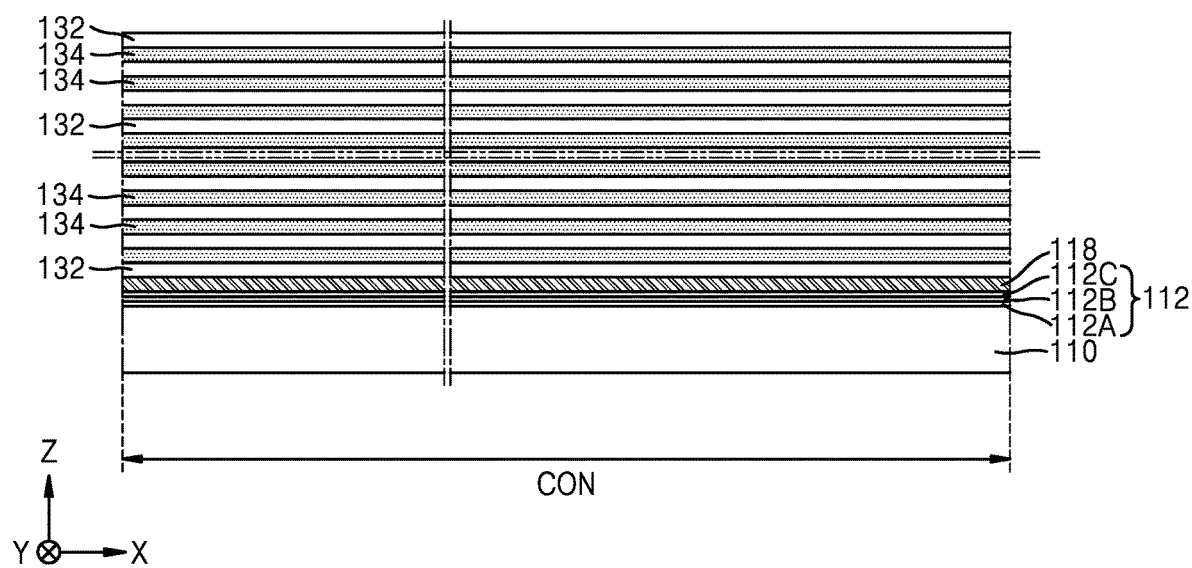

Referring to FIGS. 4A and 4B, a substrate 110 including the memory cell region MEC and the connection region CON may be prepared.

The memory cell region MEC may be a region in which a memory cell array of an IC device is arranged, while the connection region CON may be a region in which structures configured to electrically connect the memory cell array in the memory cell region MEC to peripheral circuits. Connection regions CON may be respectively on both sides of the memory cell region MEC in a first lateral direction (X direction). The substrate 110 may include a semiconductor material, such as polysilicon.

Referring to FIGS. 4A and 4B, an insulating plate 112 and an upper conductive plate 118 may be sequentially formed on the substrate 110 in the memory cell region MEC and the connection region CON. The insulating plate 112 may include a multilayered insulating film including a first insulating film 112A, a second insulating film 112B, and a third insulating film 112C. In embodiments, the first insulating film 112A and the third insulating film 112C may include a silicon oxide film, and the second insulating film 112B may include a silicon nitride film. The upper conductive plate 118 may include a doped polysilicon film, a metal film, or a combination thereof. The metal film may include tungsten (W), without being limited thereto.

A plurality of insulating layers 132 and a plurality of sacrificial insulating films 134 may be alternately stacked one by one on the upper conductive plate 118. The plurality of insulating films 132 may include silicon oxide film, and the plurality of sacrificial insulating films 134 may include silicon nitride. The plurality of sacrificial insulating films 134 may respectively ensure spaces for forming a plurality of gate lines (refer to GL in FIGS. 7A and 7B) in a subsequent process.

Figure 5A:
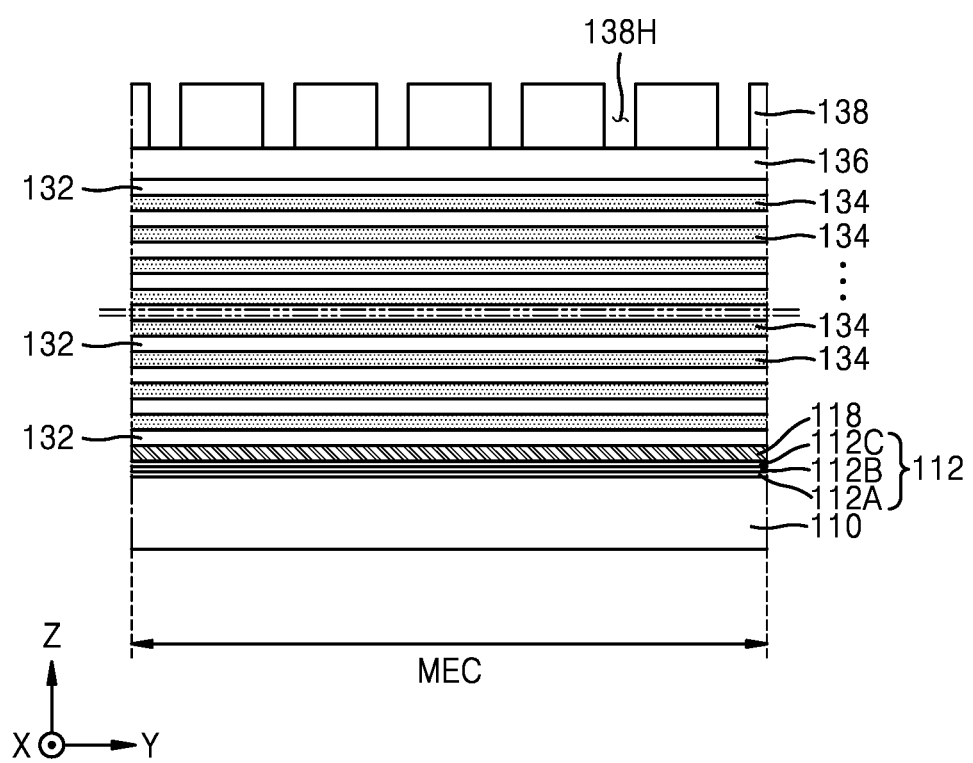
Figure 5B:
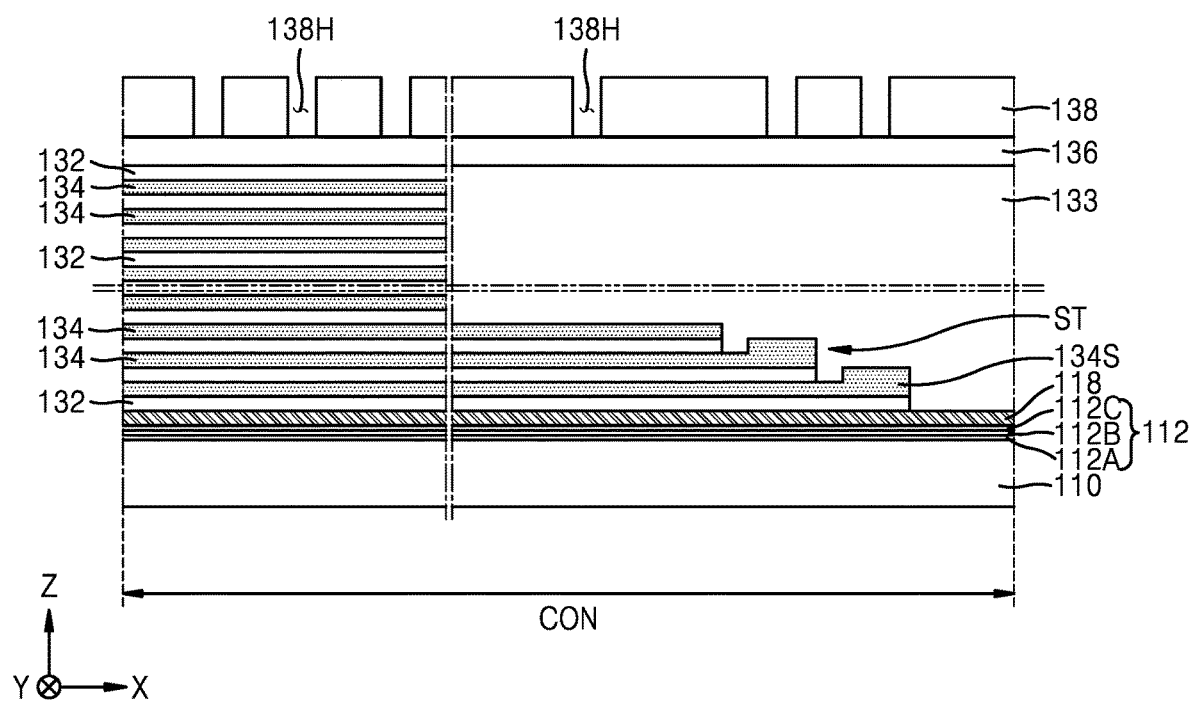

Referring to FIGS. 5A and 5B, a portion of each of the plurality of insulating films 132 and the plurality of sacrificial insulating films 134 may be removed using a photolithography process from the connection region CON of the resultant structure of FIGS. 4A and 4B. Thus, a staircase structure ST in which one end of each of the plurality of insulating films 132 and the plurality of sacrificial insulating films 134 has a gradually smaller width in a direction away from the substrate 110 in a lateral direction may be formed. Afterwards, a sacrificial pad unit 134S having an increased thickness may be formed at the one end of each of the plurality of sacrificial insulating films 134 included in the staircase structure ST.

In embodiments, the formation of the sacrificial pad unit 134S at the one end of each of the plurality of sacrificial insulating films 134 may include removing portions of the plurality of insulating films 132 to expose the one end of each of the plurality of sacrificial insulating films 134 included in the staircase structure ST, depositing an additional film on the exposed one end of each of the plurality of sacrificial insulating films 134, and patterning the additional film to leave the sacrificial pad unit 134S. The additional film may include the same material as a constituent material of the plurality of sacrificial insulating films 134.

Thereafter, an insulating block 133 may be formed to cover the staircase structure ST and the upper conductive plate 118 in the connection region CON. As a result, the obtained resultant structure may be planarized using a chemical mechanical polishing (CMP) process to remove unnecessary films, and thus, a top surface of the insulating film 132 that is at a highest level may be exposed.

Afterwards, in the memory cell region MEC and the connection region CON, a middle insulating film 136 may be formed to cover a top surface of each of the insulating film 132 and the insulating block 133 that is at the highest level. Each of the insulating block 133 and the middle insulating film 136 may include a silicon oxide film.

In the memory cell region MEC and the connection region CON, a mask pattern 138 having a plurality of openings 138H may be formed on the middle insulating film 136. A detailed configuration of the mask pattern 138 may be substantially the same as that of the mask pattern MP, which has been described with reference to FIGS. 2A and 2B.

Figure 6A:
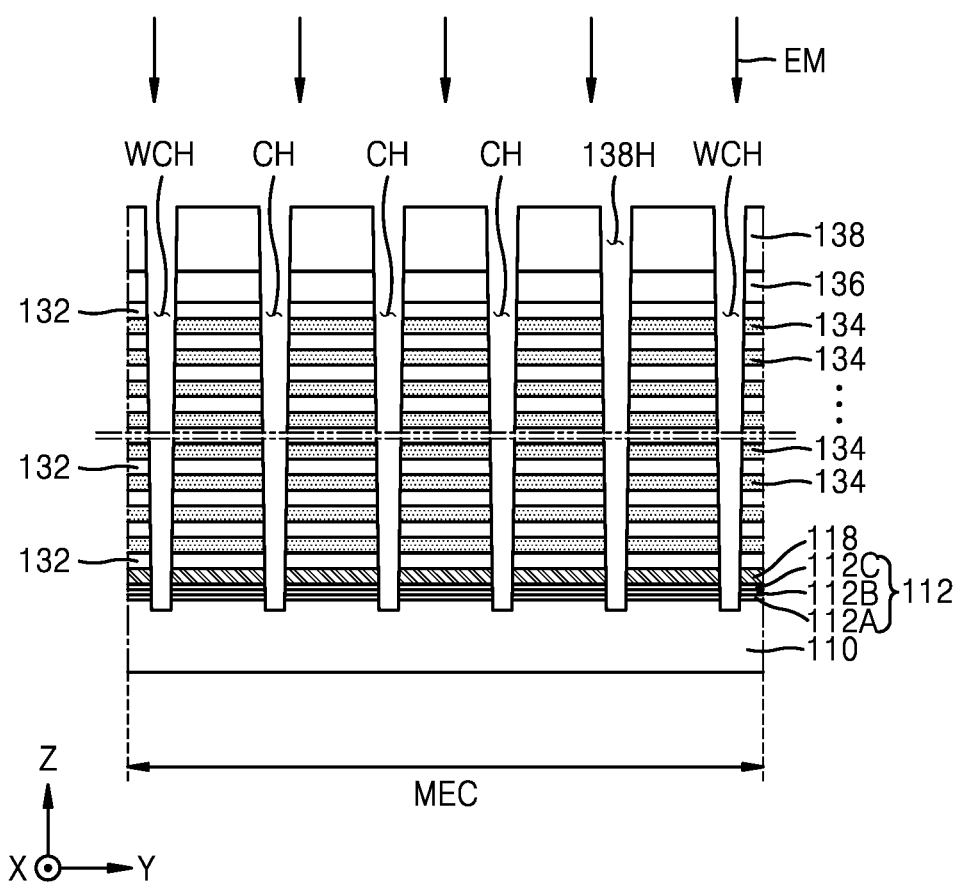
Figure 6B:
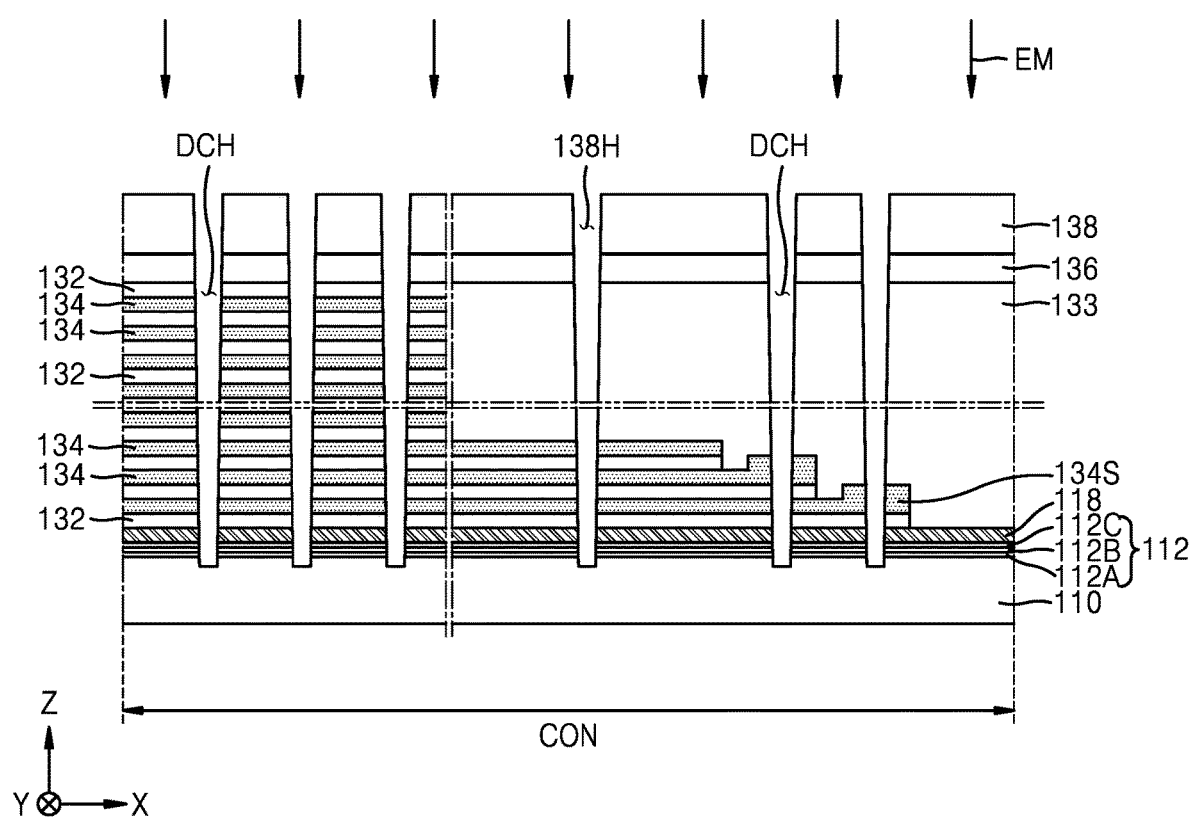

Referring to FIGS. 6A and 6B, in the resultant structure of FIGS. 5A and 5B, by using the mask pattern 138 as an etch mask and using plasma generated from an etching gas mixture EM according to embodiments, an insulating structure including a stack structure of the middle insulating film 136, the insulating block 133, the plurality of insulating films 132, and the plurality of sacrificial insulating films 134, the upper conductive plate 118, and the insulating plate 112 may be anisotropically dry etched through the plurality of openings 138H formed in the mask pattern 138 in the connection region CON and the memory cell region MEC. Thus, a plurality of vertical holes may be formed. The plurality of vertical holes may include a plurality of channel holes CH and a plurality of word line cut holes WCH, which are in the memory cell region MEC, and a plurality of dummy channel holes DCH, which are in the connection region CON.

To form the plurality of vertical holes including the plurality of channel holes CH, the plurality of word line cut holes WCH, and the plurality of dummy channel holes DCH, substantially the same methods as the processes of forming the plurality of vertical holes 20H, which have been described with reference to FIGS. 1, 2A to 2C, and FIGS. 3A to 3D, may be used.

To form the plurality of vertical holes including the plurality of channel holes CH, the plurality of word line cut holes WCH, and the plurality of dummy channel holes DCH, the etching gas mixture EM according to the embodiments may be supplied onto the substrate 110 in a plasma atmosphere according to the pulse diagrams described with reference to FIGS. 3A to 3D or pulse diagrams variously modified and changed therefrom within the scope of embodiments.

During the formation of the plurality of vertical holes including the plurality of channel holes CH, the plurality of word line cut holes WCH, and the plurality of dummy channel holes DCH, a first etching gas mixture and a second etching gas mixture having different compositions according to embodiments may be alternately supplied as the etching gas mixture EM depending on constituent materials of a film to be etched.

In embodiments, the process of forming the plurality of vertical holes including the plurality of channel holes CH, the plurality of word line cut holes WCH, and the plurality of dummy channel holes DCH may include a plurality of first etching processes and a plurality of second etching processes. The plurality of first etching processes may include anisotropically etching the insulating films 132 including the silicon oxide film through the plurality of openings 138H formed in the mask pattern 138 by using first plasma generated from the first etching gas mixture according to the embodiments. The plurality of second etching processes may include anisotropically etching the sacrificial insulating films 134 including silicon nitride through the plurality of openings 138H formed in the mask pattern 138 by using second plasma generated from the second etching gas mixture according to the embodiments.

Each of the first etching gas mixture and the second etching gas mixture may have the same composition as that of the above-described etching gas mixture according to embodiments. However, the first etching gas mixture may include a nitrogen-containing compound and an inert gas, and the nitrogen-containing compound may be selected from the compound represented by Formula 1 and the compound represented by Formula 2, which are described above. When necessary, the first etching gas mixture may further include at least one CD-adjusting gas selected from a fluorine-containing gas and an oxygen-containing gas. Details of the nitrogen-containing compound, the inert gas, the fluorine-containing gas, and the oxygen-containing gas may be the same as those in the above-described etching gas mixture according to embodiments. The second etching gas mixture may include a nitrogen-containing compound, an inert gas, and a C1 to C4 fluorinated hydrocarbon compound that does not include any nitrogen atoms. The nitrogen-containing compound may be selected from the compound represented by Formula 1 and the compound represented by Formula 2, which are described above. When necessary, the etching gas mixture may further include at least one CD-adjusting gas selected from a fluorine-containing gas and an oxygen-containing gas. Details of the nitrogen-containing compound, the inert gas, the fluorinated hydrocarbon compound, the fluorine-containing gas, and the oxygen-containing gas may be the same as those in the above-described etching gas mixture according to embodiments.

During a plasma etching process for forming the plurality of vertical holes including the plurality of channel holes CH, the plurality of word line cut holes WCH, and the plurality of dummy channel holes DCH as described with reference to FIGS. 6A and 6B, films to be etched may be etched at a relatively high etch selectivity with respect to the mask pattern 138, a desired etch rate may be obtained during the formation of the plurality of vertical holes including the plurality of channel holes CH, the plurality of word line cut holes WCH, and the plurality of dummy channel holes DCH, and the CD of the plurality of vertical holes may be easily controlled.

Figure 7A:
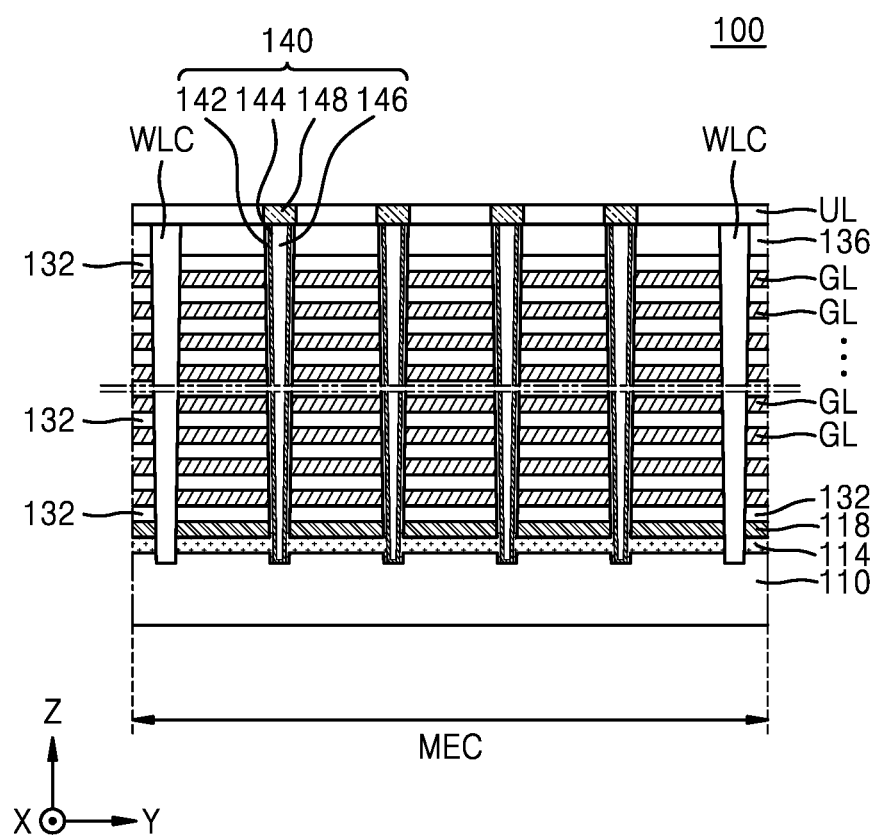
Figure 7B:
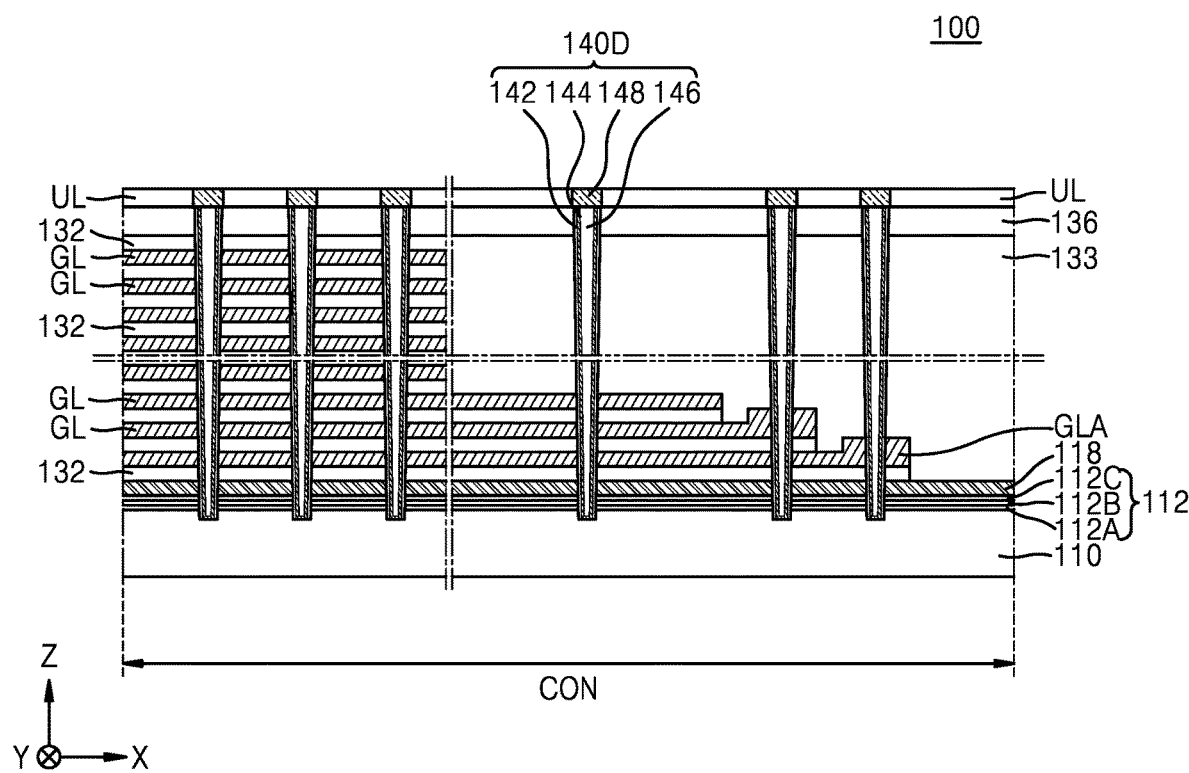

Referring to FIGS. 7A and 7B, in the resultant structure of FIGS. 6A and 6B, the mask pattern 138 and etching byproducts may be removed by using an ashing process and a stripping process. Thereafter, a plurality of channel structures 140 filling the plurality of channel holes CH may be formed in the memory cell region MEC, and a plurality of word line cut structures WLC filling the plurality of word line cut holes WCH may be formed in the memory cell region MEC. A plurality of dummy channel structures 140D filling the plurality of dummy channel holes DCH may be formed in the connection region CON. An upper insulating film UL covering the middle insulating film 136 may be formed in the connection region CON and the memory cell region MEC. The upper insulating film UL may include a silicon oxide film.

In embodiments, the plurality of channel structures 140 and the plurality of dummy channel structures 140D may be simultaneously formed. Each of the plurality of channel structures 140 and the plurality of dummy channel structure 140D may include a gate dielectric film 142, a channel region 144, a buried insulating film 146, and a drain region 148.

The gate dielectric film 142 may include a tunneling dielectric film, a charge storage film, and a blocking dielectric film, which are sequentially formed on the channel region 144. The tunneling dielectric film may include silicon oxide, hafnium oxide, aluminum oxide, zirconium oxide, and/or tantalum oxide. The charge storage film may include silicon nitride, boron nitride, silicon boron nitride, or doped polysilicon. The blocking dielectric film may include silicon oxide, silicon nitride, or a metal oxide having a higher dielectric constant than silicon oxide. The metal oxide may include hafnium oxide, aluminum oxide, zirconium oxide, tantalum oxide, or a combination thereof.

The channel region 144 may have a cylindrical shape. The channel region 144 may include doped polysilicon or undoped polysilicon.

The buried insulating film 146 may fill an inner space of the channel region 144. The buried insulating film 146 may include an insulating material. For example, the buried insulating film 146 may include silicon oxide, silicon nitride, silicon oxynitride, or a combination thereof. In some embodiments, the buried insulating film 146 may be omitted. In this case, the channel region 144 may have a pillar structure having no inner space.

The drain region 148 may include doped polysilicon film. The plurality of channel structures 140 may be insulated from a plurality of drain regions 148 included in the plurality of dummy channel structure 140D by the upper insulating film UL.

After the plurality of channel structures 140 and the plurality of dummy channel structure 140D are formed and before the plurality of word line cut structures WLC are formed, the insulating plate 112 may be selectively removed through the plurality of word line cut holes WCH only in the memory cell region MEC, from among the memory cell region MEC and the connection region CON, and the resultant empty space may be filled with a lower conductive plate 114. The lower conductive plate 114 may include a doped polysilicon film, a metal film, or a combination thereof. The metal film may include tungsten (W), without being limited thereto. In the memory cell region MEC, the lower conductive plate 114 and the upper conductive plate 118 may serve as a source region configured to supply current to vertical memory cells included in a cell array structure in the memory cell region MEC.

During the removal of the insulating plate in the memory cell region MEC, portions of the gate dielectric film 142 in the memory cell region MEC, which are included in the channel structure 140 and adjacent to the insulating plate 112, may be removed together with the insulating plate 112. As a result, the lower conductive plate 114 may pass through a partial region of the gate dielectric film 142 in a lateral direction and come into contact with the channel region 144.

In addition, after the lower conductive plate 114 is formed and before the plurality of word line cut structures WLC are formed, in the memory cell region MEC and the connection region CON, the plurality of sacrificial insulating films 134 and the sacrificial pad unit 134S (refer to FIGS. 5A and 5B) may be replaced by the plurality of gate lines GL and a plurality of conductive pad units GLA through the plurality of word line cut holes WCH. After the lower conductive plate 114, the plurality of gate lines GL, and the plurality of conductive pad units GLA are formed, the plurality of word line cut structures WLC may be formed to fill the plurality of word line cut holes WCH.

Each of the plurality of gate lines GL and the plurality of conductive pad units GLA may include a metal (e.g., tungsten, nickel, cobalt, and tantalum), a metal silicide (e.g., tungsten silicide, nickel silicide, cobalt silicide, and tantalum silicide), doped polysilicon, or a combination thereof. Each of the plurality of word line cut structures WLC may include an insulating structure. In embodiments, the insulating structure may include silicon oxide, silicon nitride, silicon oxynitride, or a low-k dielectric material. For example, the insulating structure may include a silicon oxide film, a silicon nitride film, a silicon oxynitride (SiON) film, a silicon oxycarbonitride (SiOCN) film, a silicon carbonitride (SiCN) film, or a combination thereof.

In the IC device 100 manufactured using the method described with reference to FIGS. 4A to 7B, as the stacked number of gate lines GL arranged three-dimensionally in the vertical direction increases, an aspect ratio of the plurality of vertical holes (e.g., the plurality of channel holes CH and the plurality of dummy channel holes DCH shown in FIGS. 6A and 6B) may increase. Thus, it may be necessary to form the plurality of vertical holes, each of which has a deep and narrow 3D space. According to embodiments, because plasma generated from the etching gas mixture according to embodiments is used to form the plurality of vertical holes, during the etching process for forming the plurality of vertical holes, the films to be etched may be etched at a relatively high etch selectivity with respect to the mask pattern 138, a desired etch rate may be obtained during the formation of the plurality of vertical holes, and the CD of the plurality of vertical holes may be easily controlled. Therefore, the reliability of the IC device 100 may be obtained, and productivity in the process of manufacturing the IC device 100 may be improved.

FIGS. 8A to 8H are cross-sectional views illustrating a process sequence of a method of manufacturing an IC device (refer to 300 in FIG. 8H) according to embodiments. A method of manufacturing the IC device 300 including a capacitor of DRAM, according to an embodiment, will be described with reference to FIGS. 8A to 8H.

Figure 8A:
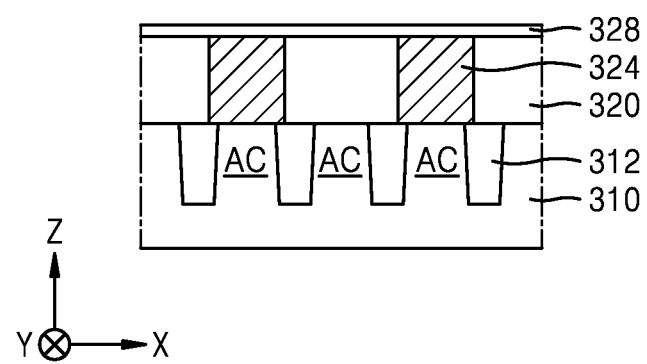
FIGS. 8A to 8H are cross-sectional views illustrating a process sequence of a method of manufacturing an IC device, according to embodiments.

Referring to FIG. 8A, a lower structure 320 may be formed on a substrate 310 including a plurality of active regions AC, and then a plurality of conductive regions 324 may be formed to be connected to the plurality of active regions AC through the lower structure 320. Thereafter, an insulating film 328 may be formed to cover the lower structure 320 and the plurality of conductive regions 324.

The substrate 310 may include an element semiconductor (e.g., Si or Ge), or a compound semiconductor (e.g., SiC, GaAs, InAs, or InP). The substrate 310 may include a semiconductor substrate and at least one insulating film or structures including at least one conductive region, which are formed on the semiconductor substrate. The conductive region may include, for example, a doped well or a doped structure. The plurality of active regions AC may be defined by a plurality of device isolation regions 312 formed in the substrate 310. The device isolation region 312 may include a silicon oxide film, a silicon nitride film, a silicon oxynitride film, or a combination thereof.

In embodiments, the lower structure 320 may include an insulating film including a silicon oxide film, a silicon nitride film, or a combination thereof. In other embodiments, the lower structure 320 may include various conductive regions, for example, wiring layers, contact plugs, and transistors, and insulating films configured to electrically insulate the conductive regions from each other. The plurality of conductive regions 324 may include polysilicon, a metal, a conductive metal nitride, a metal silicide, or a combination thereof. The lower structure 320 may include a plurality of bit lines (not shown), which constitute the IC device 300. Each of the plurality of conductive regions 324 may include a buried contact (not shown) and a lower electrode landing pad (not shown), which constitutes the IC device 300.

The insulating film 328 may include an insulating material having an etch selectivity with respect to the lower structure 320. In embodiments, the insulating film 328 may include a silicon boron nitride (SiBN) film, a silicon carbonitride (SiCN) film, a silicon nitride (SiN) film, or a combination thereof. The insulating film 328 may be used as an etch stop layer in a subsequent process.

Figure 8B:
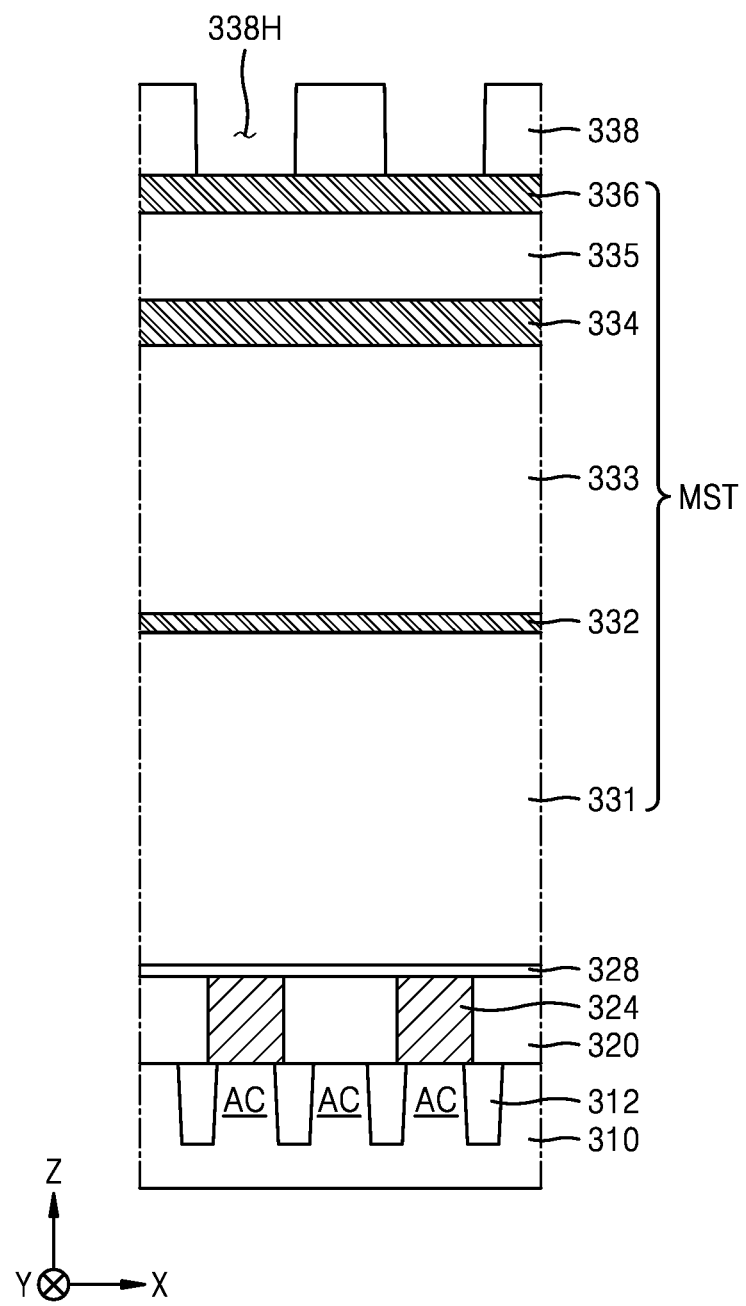

Referring to FIG. 8B, a mold structure MST may be formed on the insulating film 328 in the resultant structure of FIG. 8A, and a mask pattern 338 having a plurality of openings 338H may be formed on the mold structure MST.

The mold structure MST may include a plurality of mold films and a plurality of support films. As shown in FIG. 8B, the mold structure MST may include a first mold film 331, a first support film 332, a second mold film 333, a second support film 334, a third mold film 335, and a third support film 336, which are sequentially stacked on the insulating film 328, but the inventive concept is not limited thereto.

In embodiments, each of the first mold film 331, the second mold film 333, and the third mold film 335 may include a silicon oxide film, a silicon nitride film, or a combination thereof. For example, each of the first mold film 331 and the second mold film 333 may include a silicon oxide film, and the third mold film 335 may include a silicon nitride film, without being limited thereto.

In embodiments, each of the first support film 332, the second support film 334, and the third support film 336 may include a silicon nitride (SiN) film, a silicon carbonitride (SiCN) film, a silicon boron nitride (SiBN) film, or a combination thereof. For example, each of the first support film 332, the second support film 334 and the third support film 336 may include a silicon carbonitride (SiCN) film. A detailed configuration of the mask pattern 338 may be substantially the same as that of the mask pattern MP, which has been described with reference to FIGS. 2A and 2B.

Figure 8C:
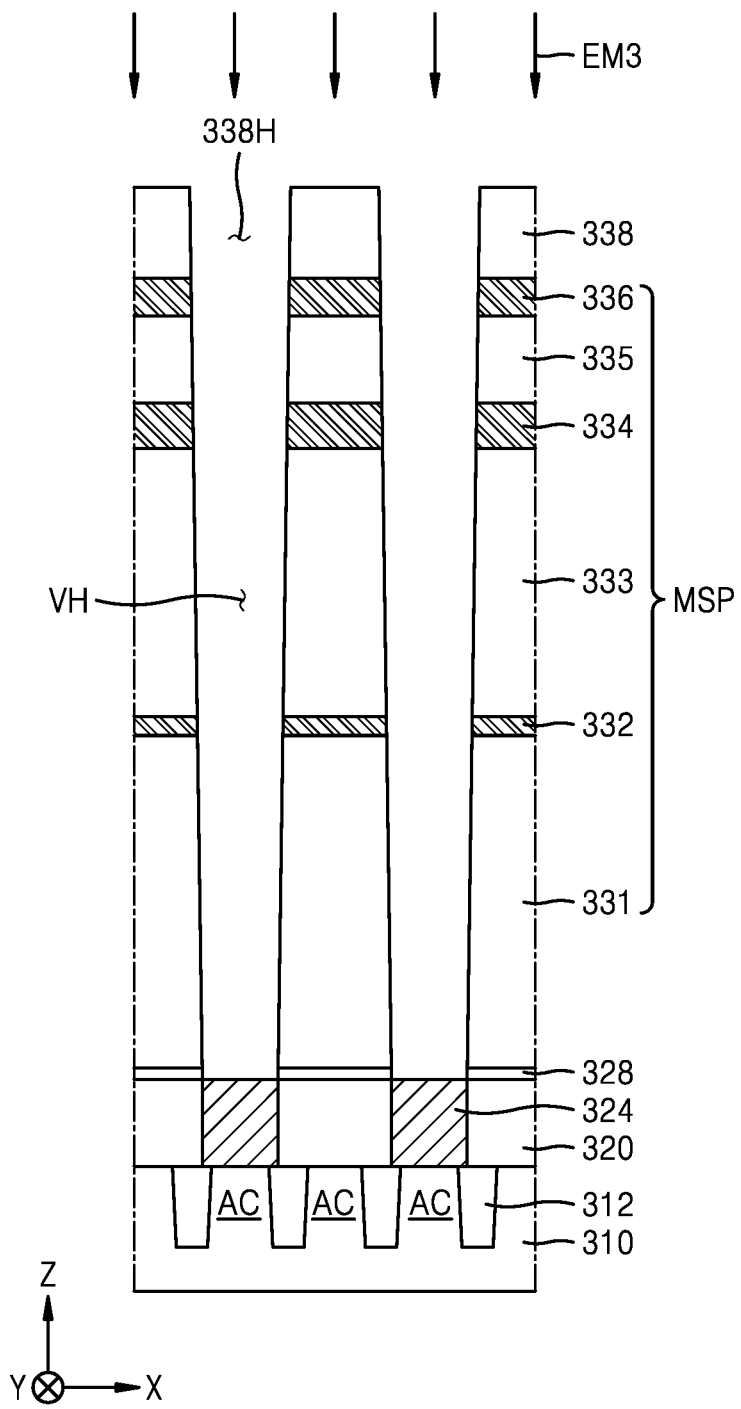

Referring to FIG. 8C, in the resultant structure of FIG. 8B, the mold structure MST and the insulating film 328 may be anisotropically dry etched using the mask pattern 338 as an etch mask and by using the insulating film 328 as an etch stop layer, and thus, a mold structure pattern MSP defining a plurality of vertical holes VH may be formed. The formation of the plurality of vertical holes VH may include etching the insulating film 328 to expose the conductive region 324 at the bottom of each of the plurality of vertical holes VH.

To form the plurality of vertical holes VH, substantially the same methods as the processes of forming the plurality of vertical holes 20H, which have been described with reference to FIGS. 1, 2A to 2C, and FIGS. 3A to 3D, may be used.

To form the plurality of vertical holes VH, an etching gas mixture EM3 according to the embodiments may be supplied onto the substrate 310 in a plasma atmosphere according to the pulse diagrams described with reference to FIGS. 3A to 3D or pulse diagrams variously modified and changed therefrom within the scope of the inventive concept.

During the formation of the plurality of vertical holes VH, a first etching gas mixture and a second etching gas mixture having different compositions according to embodiments may be alternately supplied as the etching gas mixture EM3 depending on constituent materials of a film to be etched. Details of the first etching gas mixture and the second etching gas mixture may be substantially the same as those described with reference to FIGS. 6A and 6B.

In embodiments, the process of forming the plurality of vertical holes VH may include a plurality of first etching processes and a plurality of second etching processes. The plurality of first etching processes may include anisotropically etching films to be etched (e.g., the first mold film 331 and the second mold film 333) including the silicon oxide film through the plurality of openings 338H formed in the mask pattern 338 by using first plasma generated from the first etching gas mixture according to the embodiments. The plurality of second etching processes may include anisotropically etching films to be etched (e.g., the insulating film 328, the first support film 332, the second support film 334, the third mold film 335, and the third support film 336) including silicon nitride through the plurality of openings 338H formed in the mask pattern 338 by using second plasma generated from the second etching gas mixture according to the embodiments.

Figure 9:
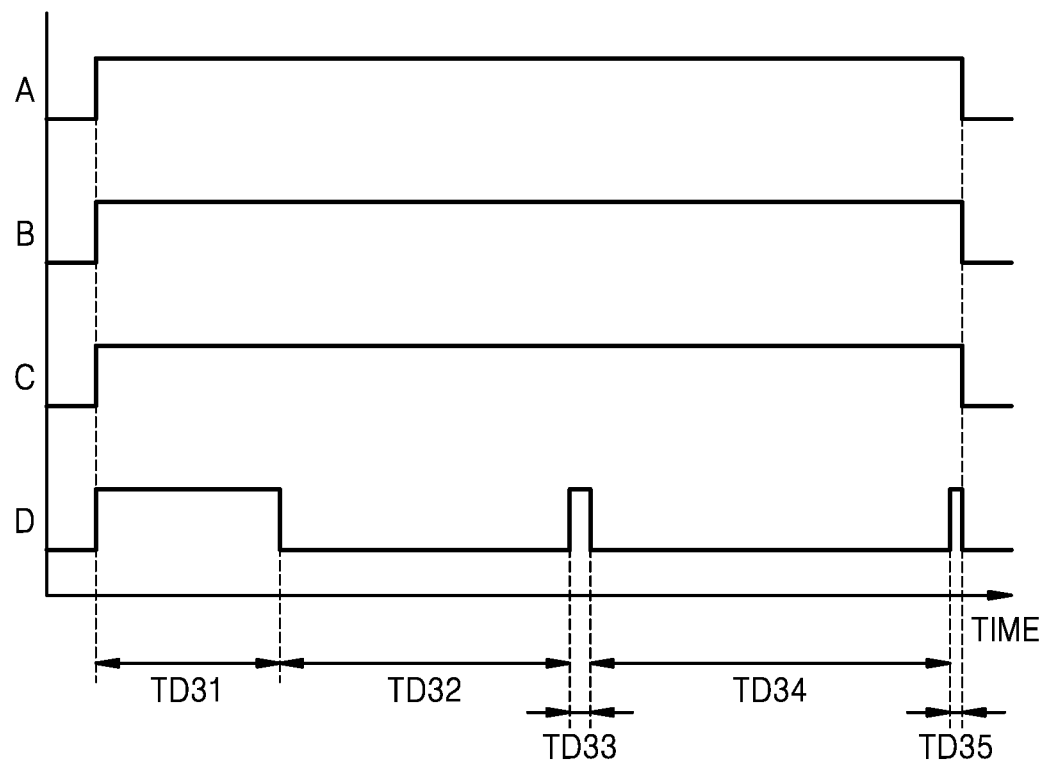
FIG. 9 shows a pulse diagram of components included in an etching gas mixture supplied onto a substrate in a plasma atmosphere to form a plurality of vertical holes by using a method of manufacturing an IC device, according to embodiments.

FIG. 9 shows a pulse diagram of components included in an etching gas mixture supplied onto a substrate 310 in a plasma atmosphere to form the plurality of vertical holes VH in a manner described with reference to FIG. 8C.

In embodiments, to form the plurality of vertical holes VH as described with reference to FIG. 8C, as shown in FIG. 9, a nitrogen-containing compound A, an inert gas B, and a CD-adjusting gas C may be continuously supplied onto the substrate 10 in the plasma atmosphere, and a fluorinated hydrocarbon compound D may be intermittently supplied onto the substrate 310 only during some time periods TD31, TD33, and TD35. In FIG. 9, the time period TD31 may correspond to a time period during which the third support film 336, the third mold film 335, and the second support film 334 are sequentially anisotropically etched, a time period TD32 may correspond to a time period during which the second mold film 333 is anisotropically etched, the time period TD33 may correspond to a time period during which the first support film 332 is anisotropically etched, a time period TD34 may correspond to a time period during which the first mold film 331 is anisotropically etched, and the time period TD35 may correspond to a time period during which the insulating film 328 is anisotropically etched. However, the inventive concept is not limited to the example shown in FIG. 9, and various modifications and changes may be made within the scope of embodiments.

During the plasma etching process for forming the plurality of vertical holes VH as described with reference to FIG. 8C, films to be etched may be etched at a relatively high etch selectivity with respect to the mask pattern 338, a desired etch rate may be obtained during the formation of the plurality of vertical holes VH, and the CD of the plurality of vertical holes VH may be easily controlled.

Figure 8D:
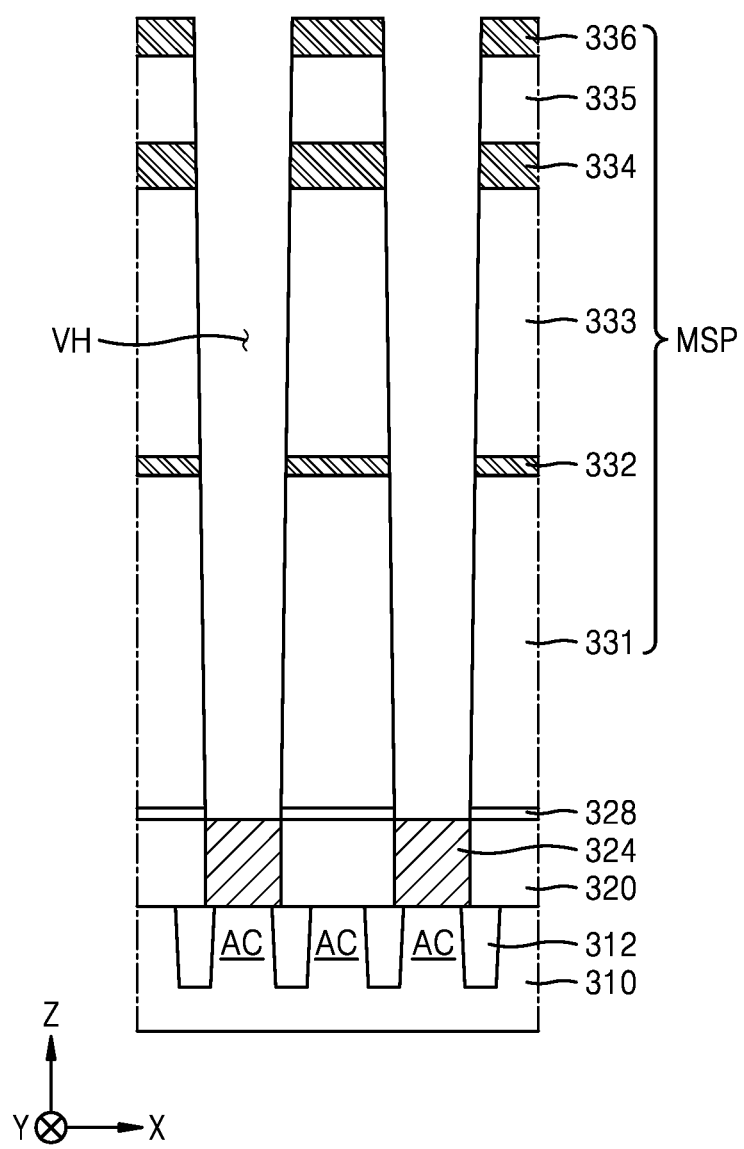

Referring to FIG. 8D, in the resultant structure of FIG. 8C, the mask pattern 338 and etching byproducts may be removed using an ashing process and a stripping process to expose a top surface of the third support film 336.

Figure 8E:
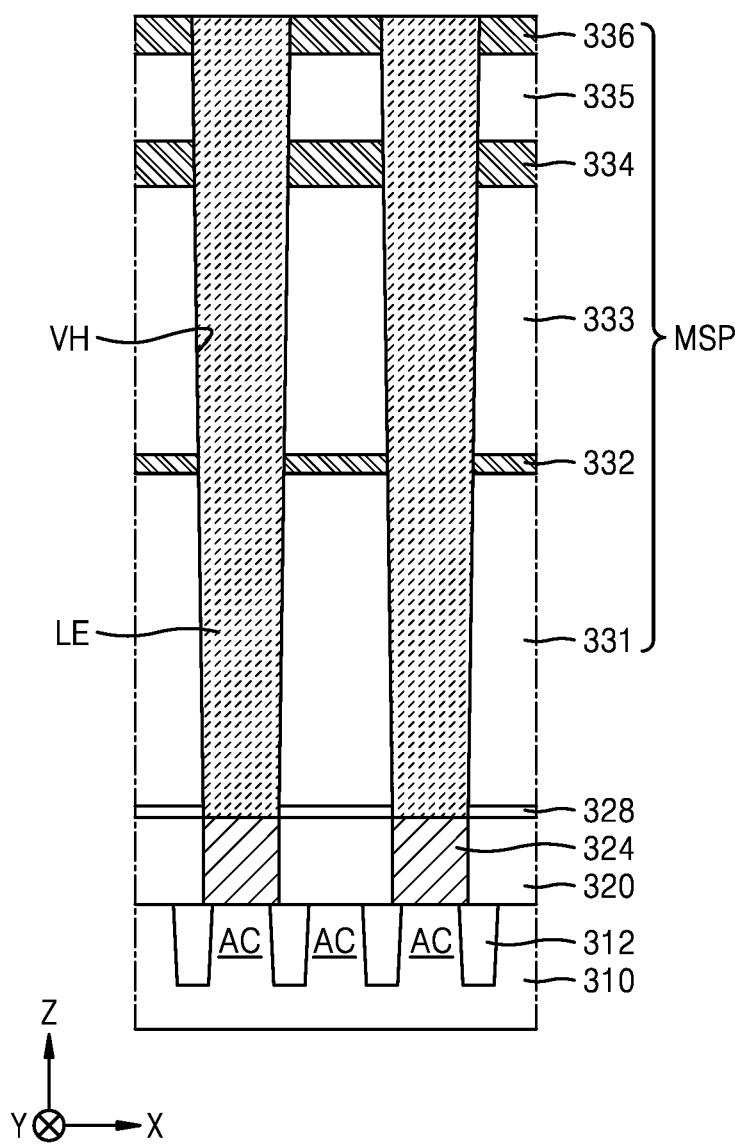

Referring to FIG. 8E, in the resultant structure of FIG. 8D, a plurality of lower electrodes LE may be formed to fill the plurality of vertical holes VH.

In embodiments, to form the plurality of lower electrodes LE, a conductive layer may be formed on the resultant structure of FIG. 8D to fill the plurality of vertical holes VH and cover the top surface of the third support film 336. To form the conductive layer, a chemical vapor deposition (CVD) process, a plasma-enhanced CVD (PECVD), a metal organic CVD (MOCVD) process, or an atomic layer deposition (ALD) process may be used. Afterwards, a portion of the conductive layer may be removed by using an etchback process or a chemical mechanical polishing (CMP) process to expose the top surface of the third support film 336.

In embodiments, the plurality of lower electrodes LE may include a metal film, a conductive metal oxide film, a conductive metal nitride film, a conductive metal oxynitride film, or a combination thereof. In embodiments, each of the plurality of lower electrodes LE may include niobium (Nb), Nb oxide, Nb nitride, Nb oxynitride, titanium (Ti), Ti oxide, Ti nitride, Ti oxynitride, cobalt (Co), Co oxide, Co nitride, Co oxynitride, Sn, Sn oxide, Sn nitride, Sn oxynitride, or a combination thereof. For example, each of the plurality of lower electrodes LE may include NbN, TiN, CoN, $SnO_2$, or a combination thereof. In other embodiments, each of the plurality of lower electrodes LE may include tantalum nitride (TaN), titanium aluminum nitride (TiAlN), tantalum aluminum nitride (TaAlN), vanadium (V), vanadium nitride (VN), molybdenum (Mo), molybdenum nitride (MoN), tungsten (W), tungsten nitride (WN), ruthenium (Ru), ruthenium oxide ($RuO_2$), strontium ruthenate ($SrRuO_3$), iridium (Ir), iridium oxide ($IrO_2$), platinum (Pt), platinum oxide (PtO), $(Ba,Sr)RuO_3$ (BSRO), $CaRuO_3$ (CRO), $(La,Sr)CoO_3$ (LSCO), or a combination thereof. However, a constituent material of the plurality of lower electrodes LE is not limited to the examples described above.

Figure 8F:
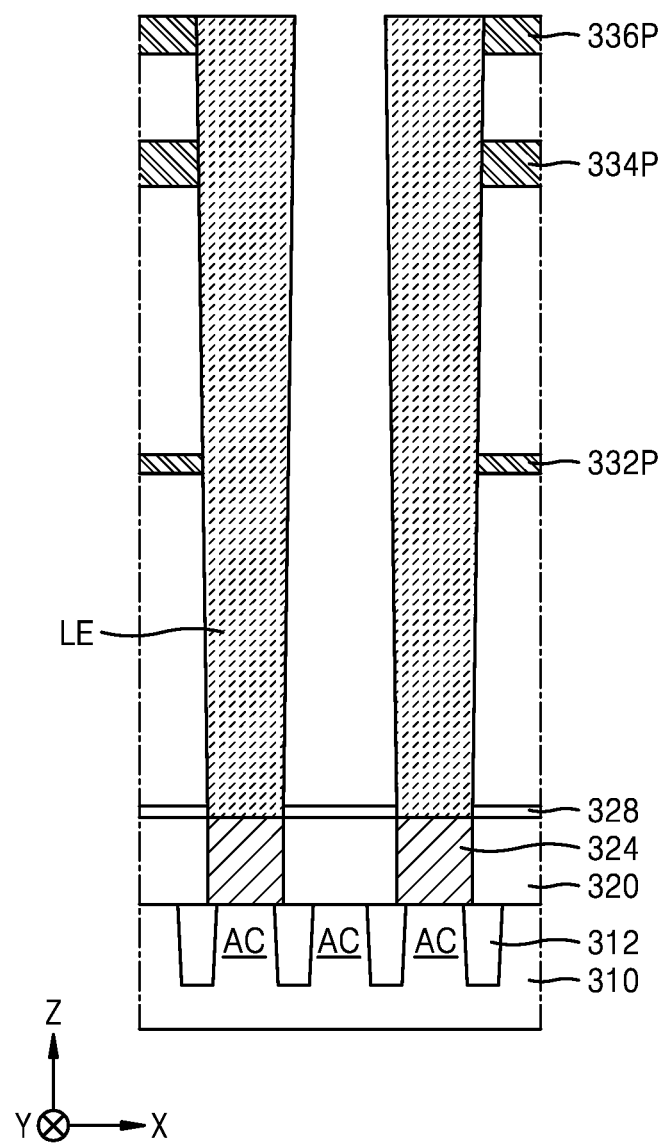

Referring to FIG. 8F, in the resultant structure of FIG. 8E, a portion of the third support film 336 may be removed to form a third support pattern 336P, and the third mold film 335 exposed as the result may be wet removed. Thereafter, a portion of the second support film 334 may be removed to form a second support pattern 334P, and the second mold film 333 exposed as the result may be wet removed. Afterwards, a portion of the first support film 332 may be removed to form a first support pattern 332P, and the first mold film 331 exposed as the result may be wet removed. After the first mold film 331, the second mold film 333, and the third mold film 335 are removed, sidewalls of the plurality of lower electrodes LE may be exposed.

Figure 8G:
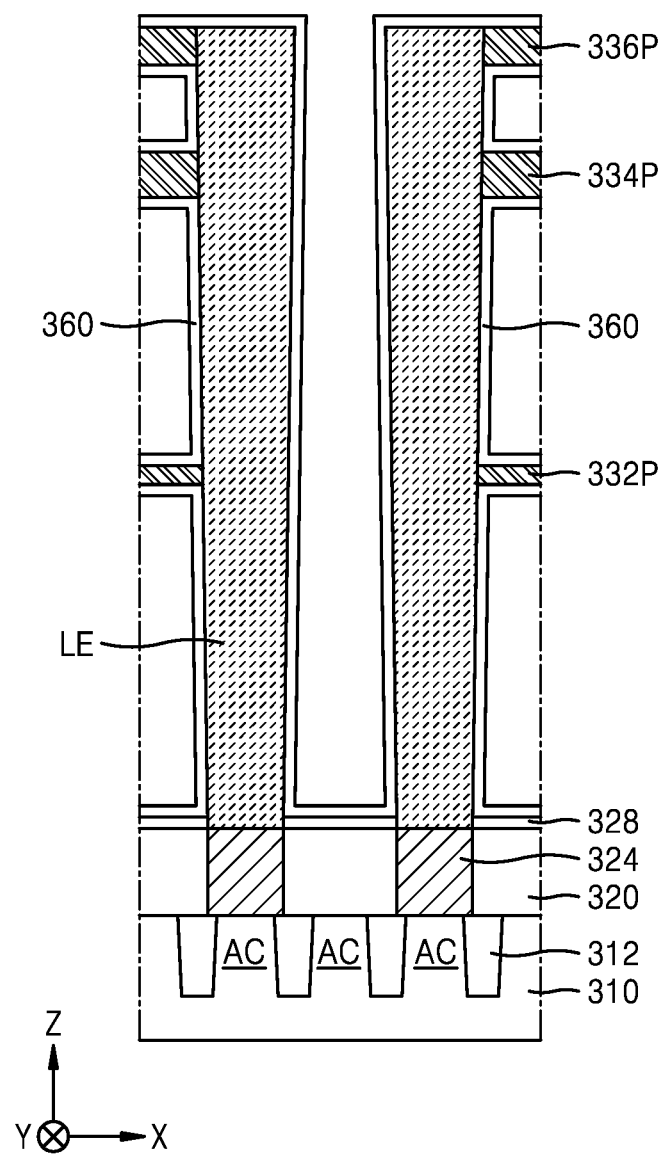

Referring to FIG. 8G, a dielectric film 360 may be formed to cover the exposed surfaces in the resultant structure of FIG. 8F. To form the dielectric film 360, an ALD process may be used.

In embodiments, the dielectric film 360 may include a high-k dielectric film. As used herein, the term "high-k dielectric film" refers to a dielectric film having a higher dielectric constant than a silicon oxide film. In embodiments, the dielectric film 360 may include a metal oxide including at least one metal selected from hafnium (Hf), zirconium (Zr), aluminum (Al), niobium (Nb), cerium (Ce), lanthanum (La), tantalum (Ta), and titanium (Ti). In embodiments, the dielectric film 360 may have a single structure including one high-k dielectric film. In other embodiments, the dielectric film 360 may have a multilayered structure including a plurality of high-k dielectric films. The high-k dielectric film may include $HfO_2$, $ZrO_2$, $Al_2O_3$, $La_2O_3$, $Ta_2O_3$, $Nb_2O_5$, $CeO_2$, $TiO_2$, $GeO_2$, or a combination thereof, without being limited thereto. In embodiments, the dielectric film 360 may have a thickness of about 20 Å to about 80 Å, without being limited thereto.

Figure 8H:
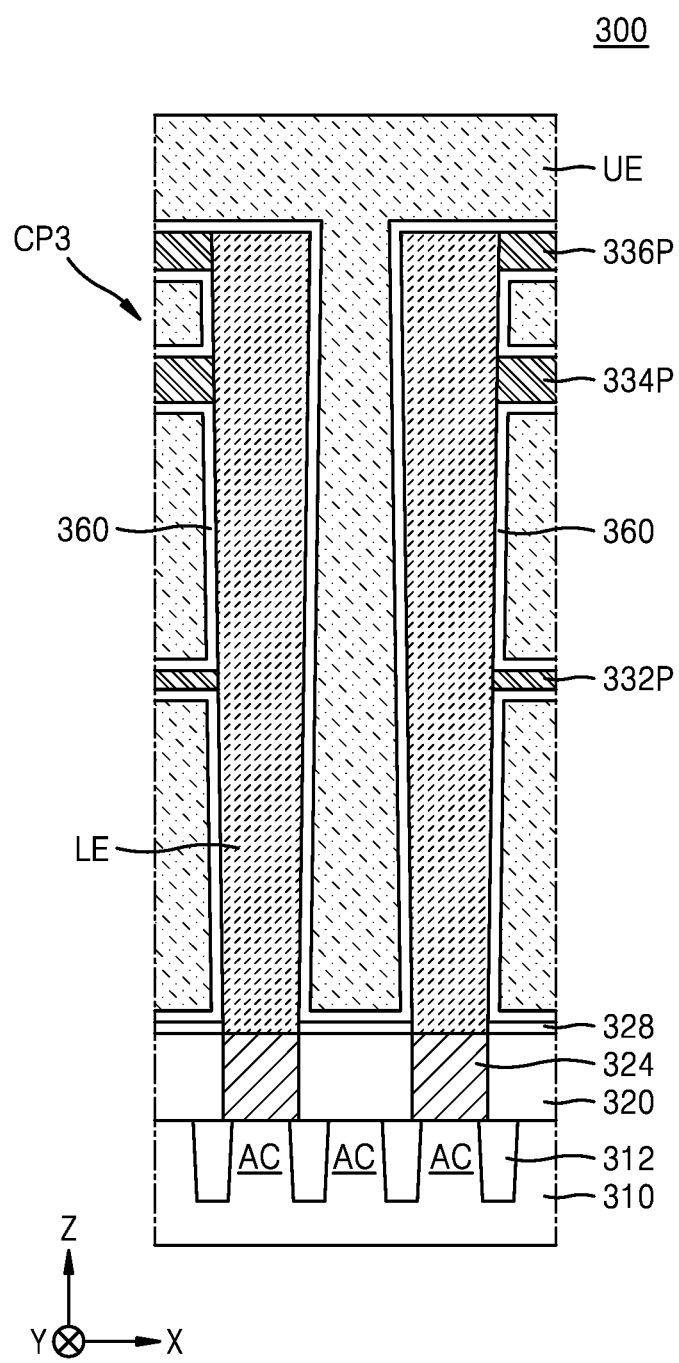

Referring to FIG. 8H, an upper electrode UE covering the dielectric film 360 may be formed on the resultant structure of FIG. 8G. In embodiments, to form the upper electrode UE, a CVD process, an MOCVD process, a physical vapor deposition (PVD) process, or an ALD process may be used.

In embodiments, the upper electrode UE may include a metal film, a conductive metal oxide film, a conductive metal nitride film, a conductive metal oxynitride film, or a combination thereof. In embodiments, the upper electrode UE may include Nb, Nb oxide, Nb nitride, Nb oxynitride, Ti, Ti oxide, Ti nitride, Ti oxynitride, Co, Co oxide, Co nitride, Co oxynitride, Sn, Sn oxide, Sn nitride, Sn oxynitride, or a combination thereof. For example, the upper electrode UE may include NbN, TiN, CoN, $SnO_2$, or a combination thereof. In other embodiments, the upper electrode UE may include TaN, TiAlN, TaAlN, V, VN, Mo, MoN, W, WN, Ru, $RuO_2$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCO), or a combination thereof. However, a constituent material of the upper electrode UE is not limited to the examples described above. In embodiments, the upper electrode UE may further include a nonmetal conductive film. The nonmetal conductive film may include a doped SiGe layer. For example, the nonmetal conductive film may include a SiGe layer doped with boron (B).

In FIG. 8H, the upper electrode UE may face the plurality of lower electrodes LE with the dielectric film 360 therebetween. The plurality of lower electrodes LE, the dielectric film 360, and the upper electrode UE may constitute a plurality of capacitors CP3.

With the miniaturization of the IC device 300, a pitch of the plurality of lower electrodes LE included in the plurality of capacitors CP3 may be reduced, and an aspect ratio of the plurality of lower electrodes LE may be increased. In the method of manufacturing the IC device 300, which has been described with reference to FIGS. 8A to 8H, when a plasma-type dry etching process is performed to form the plurality of vertical holes VH having a relatively high aspect ratio as described with reference to FIG. 8C, an etching gas mixture according to embodiments may be used. Therefore, during the plasma-type dry etching process for forming the plurality of vertical holes VH, films to be etched may be etched at a relatively high etch selectivity with respect to the mask pattern 338, a desired etch rate may be obtained during the formation of the plurality of vertical holes VH, and the CD of the plurality of vertical holes VH may be easily controlled. Therefore, the reliability of the IC device 300 may be ensured, and the manufacturing productivity of the IC device 300 may be improved.

While aspects of embodiments have been particularly shown and described, it will be understood that various changes in form and details may be made therein without departing from the spirit and scope of the following claims.

What is claimed is:

1. A method of manufacturing an integrated circuit device, the method comprising forming a hole in a silicon-containing film on a substrate by etching the silicon-containing film by using plasma generated from an etching gas mixture,
wherein the etching gas mixture comprises a nitrogen-containing compound and an inert gas, and
the nitrogen-containing compound is selected from a compound represented by Formula 1 and a compound represented by Formula 2:

  [Formula 1]

wherein in Formula 1, $R^1$ is a C2 to C3 linear or branched perfluoroalkyl group,

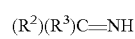  [Formula 2]

wherein in Formula 2, each of $R^2$ and $R^3$ is independently a C1 to C2 linear perfluoroalkyl group.

2. The method of claim 1, wherein the silicon-containing film comprises a plurality of silicon oxide films and a plurality of silicon nitride films, which are alternately stacked one by one on the substrate in a vertical direction, and in the forming of the hole, the hole is formed to pass through the plurality of silicon oxide films and the plurality of silicon nitride films in the vertical direction.

3. The method of claim 1, wherein the silicon-containing film comprises a first mold film, a first support film, a second mold film, and a second support film, which are sequentially stacked on the substrate in a vertical direction, each of the first mold film and the second mold film comprises a silicon oxide film, each of the first support film and the second support film comprises a silicon nitride (SiN) film, a silicon carbonitride (SiCN) film, a silicon boron nitride (SiBN) film), or a combination thereof, and, in the forming of the hole, the hole is formed to pass through the first mold film, the first support film, the second mold film, and the second support film in the vertical direction.

4. The method of claim 1, wherein the silicon-containing film comprises a silicon oxide film, and, in the forming of the hole, the hole is formed to pass through the silicon oxide film in a vertical direction.

5. The method of claim 1, wherein the nitrogen-containing compound consists essentially of the compound represented by Formula 1.

6. The method of claim 1, wherein the nitrogen-containing compound consists essentially of the compound represented by Formula 2.

7. The method of claim 1, wherein, in Formula 1, $R^1$ is a C2 to C3 linear perfluoroalkyl group.

8. The method of claim 1, wherein, in Formula 1, $R^1$ is a C2 to C3 branched perfluoroalkyl group.

9. The method of claim 1, wherein the nitrogen-containing compound comprises at least one selected from Chemical Formulas 1 to 4:

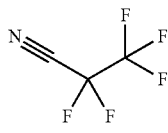

[Chemical Formula 1]

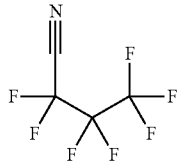

[Chemical Formula 2]

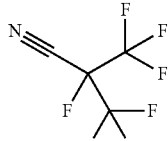

[Chemical Formula 3]

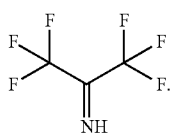

[Chemical Formula 4]

10. A method of manufacturing an integrated circuit device, the method comprising:

forming an etching target structure on a substrate, the etching target structure comprising a silicon-containing film;

forming a mask pattern on the etching target structure, the mask pattern having an opening; and forming a hole in the etching target structure by anisotropically etching the etching target structure through the opening by using the mask pattern as an etch mask and using plasma generated from an etching gas mixture, the hole extending in a vertical direction from the opening of the mask pattern toward the substrate, wherein the etching gas mixture comprises:

a nitrogen-containing compound;

an inert gas; and at least one selected from a fluorine-containing gas, an oxygen-containing gas, and a C1 to C4 fluorinated hydrocarbon compound that does not comprise any nitrogen atoms, wherein the nitrogen-containing compound is selected from a compound represented by Formula 1 and a compound represented by Formula 2:

$$(R^1)C\equiv N \quad \text{[Formula 1]}$$

wherein in Formula 1, $R^1$ is a C2 to C3 linear or branched perfluoroalkyl group, $$(R^2)(R^3)C=NH \quad \text{[Formula 2]}$$

wherein in Formula 2, each of $R^2$ and $R^3$ is independently a C1 to C2 linear perfluoroalkyl group, wherein the fluorine-containing gas comprises $NF_3$, $CF_4$, $F_2$, $SF_6$, or a combination thereof, the oxygen-containing gas comprises $O_2$, $O_3$, CO, $CO_2$, NO, $N_2O$, $NO_2$, $CH_3OH$, $C_2H_5OH$, or a combination thereof, and the fluorinated hydrocarbon compound comprises difluoromethane ($CH_2F_2$), fluoromethane ($CH_3F$), trifluoromethane ($CHF_3$), or a combination thereof.

11. The method of claim 10, wherein the mask pattern comprises an amorphous carbon layer (ACL), a spin-on-hardmask (SOH), a photoresist, or a combination thereof.

12. The method of claim 10, wherein the silicon-containing film comprises a plurality of silicon oxide films and a plurality of silicon nitride films, which are alternately stacked one by one on the substrate in the vertical direction, and, in the forming of the hole, the hole is formed to pass through the plurality of silicon oxide films and the plurality of silicon nitride films in the vertical direction.

13. The method of claim 10, wherein the silicon-containing film comprises a first mold film, a first support film, a second mold film, and a second support film, which are sequentially stacked on the substrate in the vertical direction, each of the first mold film and the second mold film comprises a silicon oxide film, each of the first support film and the second support film comprises a silicon nitride (SiN) film, a silicon carbonitride (SiCN) film, a silicon boron nitride (SiBN) film, or a combination thereof, and, in the forming of the hole, the hole is formed to pass through the first mold film, the first support film, the second mold film, and the second support film in the vertical direction.

14. The method of claim 10, wherein the nitrogen-containing compound consists essentially of a compound represented by Formula 1, and
$R^1$ is a pentafluoroethyl group, a heptafluoropropyl group, or a heptafluoroisopropyl group.

15. The method of claim 10, wherein the nitrogen-containing compound consists essentially of a compound represented by Formula 2, and,
in Formula 2, $R^2$ and $R^3$ have the same structure as each other.

16. The method of claim 10, wherein the nitrogen-containing compound comprises at least one selected from Chemical Formulas 1 to 4:

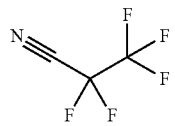

[Chemical Formula 1]

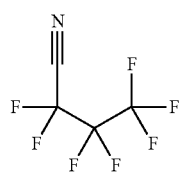

[Chemical Formula 2]

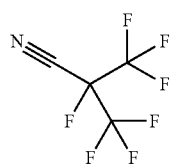

[Chemical Formula 3]

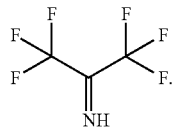

[Chemical Formula 4]

17. A method of manufacturing an integrated circuit device, the method comprising:
forming an etching target structure on a substrate, the etching target structure comprising a first silicon-containing film that does not comprise any nitrogen atoms and a second silicon-containing film comprising nitrogen atoms;
forming a mask pattern on the etching target structure, the mask pattern having an opening; and
forming a hole in the etching target structure by anisotropically etching the etching target structure by using the mask pattern as an etch mask, the hole passing through the first silicon-containing film and the second silicon-containing film in a vertical direction,
wherein the forming of the hole comprises:
anisotropically etching the first silicon-containing film through the opening by using first plasma generated from a first etching gas mixture; and
anisotropically etching the second silicon-containing film through the opening by using second plasma generated from a second etching gas mixture,
wherein the first etching gas mixture comprises a first nitrogen-containing compound and a first inert gas,
the second etching gas mixture comprises a second nitrogen-containing compound, a second inert gas, and a C1 to C4 fluorinated hydrocarbon compound that does not comprise any nitrogen atoms, and
each of the first nitrogen-containing compound and the second nitrogen-containing compound is selected from a compound represented by Formula 1 and a compound represented by Formula 2:

$(R^1)C{\equiv}N$  [Formula 1]

wherein in Formula 1, $R^1$ is a C2 to C3 linear or branched perfluoroalkyl group, $(R^2)(R^3)C{=}NH$  [Formula 2]

wherein in Formula 2, each of $R^2$ and $R^3$ is independently a C1 to C2 linear perfluoroalkyl group.

18. The method of claim 17, wherein each of the first etching gas mixture and the second etching gas mixture further comprises at least one critical dimension (CD)-adjusting gas selected from a fluorine-containing gas and an oxygen-containing gas,
the fluorine-containing gas comprises $NF_3$, $CF_4$, $F_2$, $SF_6$, or a combination thereof, and
the oxygen-containing gas comprises $O_2$, $O_3$, CO, $CO_2$, NO, $N_2O$, $NO_2$, $CH_3OH$, $C_2H_5OH$, or a combination thereof.

19. The method of claim 17, wherein, in the second etching gas mixture, the fluorinated hydrocarbon compound comprises difluoromethane ($CH_2F_2$), fluoromethane ($CH_3F$), trifluoromethane ($CHF_3$), or a combination thereof.

20. The method of claim 17, wherein each of the first nitrogen-containing compound and the second nitrogen-containing compound comprises at least one selected from Chemical Formulas 1 to 4:

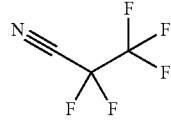

[Chemical Formula 1]

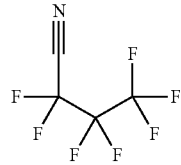

[Chemical Formula 2]

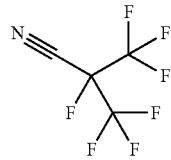

[Chemical Formula 3]

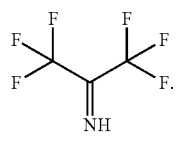

[Chemical Formula 4]

* * * * *